US010465276B2

(12) United States Patent
Robinson et al.

(10) Patent No.: US 10,465,276 B2
(45) Date of Patent: Nov. 5, 2019

(54) FACILE ROUTE TO TEMPLATED GROWTH OF TWO-DIMENSIONAL LAYERED MATERIALS

(71) Applicant: The Penn State Research Foundation, University Park, PA (US)

(72) Inventors: Joshua Alexander Robinson, Spring Mills, PA (US); Sarah Marie Eichfeld, Bellefonte, PA (US); Aleksander Felipe Piasecki, Blue Bell, PA (US); Brian Michael Bersch, Yardley, PA (US)

(73) Assignee: The Penn State Research Foundation, University Park, PA (US)

( * ) Notice: Subject to any disclaimer, the term of this patent is extended or adjusted under 35 U.S.C. 154(b) by 59 days.

(21) Appl. No.: 14/992,160

(22) Filed: Jan. 11, 2016

(65) Prior Publication Data
US 2017/0175258 A1 Jun. 22, 2017

Related U.S. Application Data

(60) Provisional application No. 62/270,277, filed on Dec. 21, 2015.

(51) Int. Cl.
*C23C 14/04* (2006.01)
*C23C 14/06* (2006.01)
*C23C 16/04* (2006.01)
*C23C 16/30* (2006.01)

(52) U.S. Cl.
CPC ........ *C23C 14/042* (2013.01); *C23C 14/0623* (2013.01); *C23C 16/042* (2013.01); *C23C 16/305* (2013.01)

(58) Field of Classification Search
CPC . C23C 14/042; C23C 14/0623; C23C 16/042; C23C 16/305
USPC ................................................ 430/324, 330
See application file for complete search history.

(56) References Cited

U.S. PATENT DOCUMENTS

| | | | | |
|---|---|---|---|---|
| 4,463,084 A | * | 7/1984 | Mitsumori | H05K 1/053 205/125 |
| 5,362,682 A | * | 11/1994 | Bozler | C30B 25/04 438/458 |
| 2006/0032329 A1 | * | 2/2006 | Rubinstein | B01D 67/0032 75/255 |
| 2014/0245946 A1 | | 9/2014 | Kong et al. | |
| 2014/0251204 A1 | | 9/2014 | Najmaei et al. | |

OTHER PUBLICATIONS

Lee et al., Synthesis of Large-Area MoS2 Atomic Layers with Chemical Vapor Deposition, 2012, Advanced Materials 24(17):2320-2325.
Dharmaraj et al., Controlled and Selective Area Growth of Monolayer Graphene on 4H—SiC Substrate by Electron-Beam-Assisted Rapid Heating, 2013, J Phys Chem C 117:19195-19202.
Jeon et al., Layer-controlled CVD growth of large-area two-dimensional MoS2 films, 2015, Nanoscale 7:1688-1695.
Novoselov et al., Two-dimensional gas of massless Dirac fermions in graphene, 2005, Nature 438:197-200.
Avouris et al., Graphene-based fast electronics and optoelectronics, 2010, Int Electron Devices Meet (IEDM10-552-IEDM10-554) 23.1.1-23.1.4.
Wang et al., Electronics and optoelectronics of two-dimensional transition metal dichalcogenides, 2012, Nat Nanotechnol 7: pp. 699-712.
Chhowalla et al., The chemistry of two-dimensional layered transition metal dichalcogenide nanosheets, 2013, Nat Chem 5: pp. 263-275.
Terrones et al., Novel hetero-layered materials with tunable direct band gaps by sandwiching different metal disulfides and diselenides, 2013, Sci Rep 3:1549, pp. 1-7.
Fang et al., Strong interlayer coupling in van der Waals heterostructures built from single-layer chalcogenides, 2014, PNAS 111:17: pp. 6198-6202.
Nakada et al., Edge state in graphene ribbons: Nanometer size effect and edge shape dependence, 1996, Phys Rev B vol. 54:24: pp. 17945-17961.
Yazyev, A Guide to the Design of Electronic Properties of Graphene Nanoribbons, 2013, Ac Chem Res vol. 46:10, pp. 2319-2328.
Li et al., MoS2 Nanoribbons: High Stability and Unusual Electronic and Magnetic Properties, 2008, J Am Chem Soc 130: pp. 16739-16744.
Erdogan et al., Transport properties of MoS2 nanoribbons: edge priority, 2012, Eur Phys J B 85:33: pp. 1-4.
Pan et al., Edge-dependent structural, electronic and magnetic properties of MoS2 nanoribbons, 2012, J Matter Chem 22:7280-7290.
Shidpour et al., The creation of the magnetic and metallic characteristics in low-width MoS2 nanoribbon (1D MoS2): A DFT study, 2009, Chem Phys 360:97-105.
Baringhaus et al., Exceptional ballistic transport in epitaxial graphene nanoribbons, 2014, Nature 506:349-354.
Sprinkle et al., Scalable templated growth of graphene nanoribbons on SiC, 2010, Nat Nanotechnol 5:727-731.
Eichfeld et al., Highly Scalable, Atomically Thin WSe2 Grown via Metal-Organic Chemical Vapor Deposition, 2015, ACS Nano 9:2080-2087.
Lin et al., Direct Synthesis of van der Waals Solids, 2014, ACS Nano 8:3715-3723.
Lin et al., Atomically Thin Heterostructures Based on Single-Layer Tungsten Diselenide and Graphene, 2014, Nano Lett 14:6936-6941.
Das et al., Beyond Graphene: Progress in Novel Two-Dimensional Materials and van der Waals Solids, 2015, Annu Rev Mater Res 45:1-27.
Boscher et al., Atmospheric pressure chemical vapour deposition of vanadium diselenide thin films, 2007 Appl Surf Sci 253:6041-6046.
Chung et al., WS2 thin films by metal organic chemical vapor deposition, 1998, J Cryst Growth 186:137-150.

(Continued)

*Primary Examiner* — Daborah Chacko-Davis
(74) *Attorney, Agent, or Firm* — Riverside Law LLP

(57) ABSTRACT

The present invention relates to methods for fabricating a laterally-limited two-dimensional structure through template synthesis. The methods of the invention are useful in forming homogenous and heterogeneous layered materials. The invention also provides structures and devices formed by the method of the present invention and uses thereof.

20 Claims, 17 Drawing Sheets

(56) References Cited

OTHER PUBLICATIONS

Hofmann et al., Thin films of molybdenum and tungsten disulphides by metal organic chemical vapour deposition, 1998, J Mater Sci 23:3981-3986.
Boscher et al., Atmospheric Pressure CVD of Molybdenum Diselenide Films on Glass, 2006, Chem Vap Depos 12:692-698.
Carmalt et al., Atmospheric pressure chemical vapour deposition of WS2 thin films on glass, 2003, Polyhedron 22:1499-1505.
Imanishi, Synthesis of MoS2 Thin Film by Chemical Vapor Deposition Method and Discharge Characteristics as a Cathode of the Lithium Secondary Battery, 1992, J Electrochem Soc 139:2082-2087.
Yu et al., Controlled Scalable Synthesis of Uniform, High-Quality Monolayer and Few-layer MoS2 Films, 2013 Sci Rep 3:1866, pp. 1-6.
Gutierrez et al., Extraordinary Room-Temperature Photoluminescence in Triangular WS2 Monolayers, 2013, Nano Lett 13:3447-3454.
Lin et al., Wafer-scale MoS2 thin layers prepared by MoO3 sulfurization, 2012, Nanoscale 4:6637-6641.
Lee et al., Atomically thin p-n junctions with van der Waals heterointerfaces, 2014, Nat Nanotechnol 9:676-681.
Roy et al., Dual-Gated MoS2/WSe2 van der waals tunnel diodes and transistors, 2015, ACS Nano vol. 9:2, pp. 2071-2079.
Roy et al., Field-Effect Transistors Built from All Two-Dimensional Material Components, 2014, ACS Nano vol. 8:6, pp. 6259-6264.

* cited by examiner

FACILE ROUTE TO TEMPLATED GROWTH OF TWO-DIMENSIONAL LAYERED MATERIALS

STATEMENT REGARDING FEDERALLY SPONSORED RESEARCH OR DEVELOPMENT

This invention was made with government support under Contract No. HR0011-13-3-0002, awarded by The Department of Defense/Defense Advanced Research Projects Agency. The Government has certain rights in the invention.

CROSS-REFERENCE TO RELATED APPLICATIONS

This application is a non-provisional of U.S. Provisional Patent Application Ser. No. 62/270,277, filed Dec. 21, 2015, the entire content of which is incorporated herein by reference.

BACKGROUND OF THE INVENTION

The isolation of graphene (one atomic layer of carbon) (Novoslev et al., 2005, Nature 438:197-200) constitutes a new paradigm in materials exploration in which atomic layer control is possible, (Avouris et al., 2012, Int Electron Devices Meet 23.1.1-4) and even though graphene is considered transformational, it is only the "tip of the iceberg." Synthesizing and heterogeneously combining atomic layered transition metal dichalcogenides (Wang et al., 2012, Nat Nanotechnol 7:699-712; Chhowalla et al., 2013, Nat Chem 5:263-75) to form van der Waals (vdW) heterostructures will be the ultimate route to tuning electronic and photonic properties. Recent advances in the synthesis of two dimensional transition metal dichalcogenide (TMDs) by methods such as powder vaporization (Lee et al., 2012, Adv Mater 24:2320-5; Lin et al., 2014, ACS Nano 8:3715-23; Huang et al., 2014, ACS Nano 8:923-30) and metal-organic chemical vapor deposition (MOCVD) (Eichfeld et al., 2015, ACS Nano 9:2080-7; Kang et al., 2015, Nature 520:656-60) have opened up new opportunities in the realization of two-dimensional (2D) electronics. However, there still remains a large challenge in the ability to synthesize uniform domains with controlled thicknesses and dimensions for large-scale device fabrication. In addition to vertical stacking of atomic layers to tune the optical and electronic properties, controlling properties of 2D materials can also be achieved by producing quasi-one-dimensional strips, known as nanoribbons.

Recently, heterogeneous integration of layered materials has been predicted to lead to completely new electronic properties (Terrones et al., 2013, Sci Rep 3:1549) resulting in a novel electronic material entirely different from the constituent layers. One such unique phenomenon that results from this heterogeneous stacking is a significant reduction in the energy bandgap compared to the constituent layers. These exciting predictions are just now beginning to be realized experimentally through manual stacking of different layers (Fang et al., 2014, PNAS 111:6198-202), and the development of bottom-up synthesis of such heterostructures is ripe for exploration.

Developing routes for templated growth will significantly enhance the ability to tune the electronic properties of these 2D materials, allow for improved morphological control, and simplify post-synthesis device fabrication. Nakada et al. first theoretically predicted a broad range of electronic properties is possible by changing the width and crystallographic orientation of the edges in a graphene nanoribbon, with properties ranging from tunable semiconductors to metals (Nakada et al., 1996, Phys Rev B 54:17945-61; Yazyev, 2013, Ac Chem Res 45:2319-28). Like graphene, TMD nanoribbons display extraordinary electronic and magnetic properties. Among TMDs, $MoS_2$ is the most widely studied and provides evidence that nanoribbons can be very effective for tuning the properties of 2D materials (Li et al., 2008, J Am Chem Soc 130:16739-44). Armchair $MoS_2$ nanoribbons are predicted to exhibit energy band gaps that vary with width and termination of edge atoms with hydrogen (Li et al., 2008, J Am Chem Soc 130:16739-44; Erdogan et al., 2012, Eur Phys J B 85:33), while zigzag $MoS_2$ nanoribbons are ferromagnetic metals, and bare zigzag nanoribbons are half-metallic (Li et al., 2008, J Am Chem Soc 130:16739-44; Erdogan et al., 2012, Eur Phys J B 85:33; Pan and Zhang, 2012, J Mater Chem 22:7280). Furthermore, the adsorption of adatoms and creation of vacancy defects in $MoS_2$ nanoribbons have crucial effects in the electronic and magnetic properties, where a net magnetic moment can be achieved through the adsorption of cobalt adatoms to the nonmagnetic armchair nanoribbons (Pan and Zhang, 2012, J Mater Chem 22:7280; Shidpour and Manteghian, 2009, Chem Phys 360:97-105).

There has been some success in achieving selective growth via specified pre-synthesis methods. The majority of methods utilize physical masks or templates for specific area growth inhibition, with a focus on synthesis of 1D nanowires to control wire placement. Templated growth utilizing physical masks of consumable materials that can be etched away post-growth have yielded ways for high throughput cost effective synthesis of nanowires, however, this leads to post-growth etching to remove the template material (Xia et al., 2003, Adv Mater 15:353-89). Physical modification of the substrate surface such as etching pillars or trenches in the surface to either confine or promote growth has also been demonstrated (Yamano et al., 2015, J Cryst Growth 425:316-21; He et al., 2005, Adv Mater 17:2098-102; Eichfeld et al., 2005 Nanotechnology 18:315201) but requires large amounts of pre- and post-growth fabrication and can ultimately affect the growth quality. Specific substrate surface functionalization as a process to induce selective growth have also been described. Lloyd et al discussed using UV radiation to decompose the surface to allow for a better seed layer for ZnO nanowires (Lloyd et al., 2015, Nanotechnology 26:265303). This caused the material to grow to a greater degree in areas where the seed layer was of better quality due to the decomposition, and therefore had the desired selective growth effect. This technique however did not preclude growth in other regions. In the field of 2D materials, there are several reports on the patterned synthesis of $MoS_2$ nanostructures based on the sulfurization of pre-patterned metal oxide or metal seeds (Han et al, 2015, Nat Commun 6:6128). Most notably, $MoS_2$ film properties and grain size can be controlled by controlling the density of MoO3 nanoribbons on the substrate which were then converted in a typical sulfurization process. However, this process still requires careful placement and control of the density of $MoO_3$ nanoribbon precursors and is only compatible with the sulfurization of molybdenum precursors. Furthermore, only the nucleation sites are defined, and the lateral growth and diffusion is not readily controllable.

There has been some selectivity reported for graphene due to theoretical predictions of electronic tuning of properties by changing the width and crystallographic orientation of the edges in a graphene nanoribbon (Nakada et al., 1996, Phys Rev B 54:17945-61; Yazyev, 2013, Ac Chem Res 45:2319-28+C18). Like graphene, two dimensional transition metal dichalcogenide (TMD) nanoribbons are predicted to display extraordinary electronic and magnetic properties. In spite of the predicted extraordinary properties of 2D nanoribbons, bottom-up template synthesis process have been quite limited. Previous works on the templated synthesis of 2D materials have focused on graphene grown from silicon carbide, where electron beam irradiation (Dharmaraj et al., 2013, J Phys Chem 117:19195-202) or crystallographic confinement (Baringhaus et al., 2014, Nature 506: 349-54; Sprinkle et al., 2010, Nat Nanotechnol 5:727-31) have been utilized. These techniques, while useful for templated growth of graphene, are limited to a single substrate: SiC. The processes developed in these techniques cannot be generalized to arbitrary substrates or other 2D materials. Extending beyond graphene, recent works have demonstrated thickness control of high quality $MoS_2$ (Jeon et al., 2015, Nanoscale 7:1688-95), but without lateral control of the growth. Therefore it is important to find simplistic techniques to allow for a wide array of 2D materials over a wide variety of substrates.

Thus, there is a need in the art for methods of templated growth of 2D materials. The present invention meets this need.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIG. 3, comprising FIG. 3A depicts a simulated $WS_2$—$WSe_2$ heterostructure. FIG. 3B depicts that the $WS_2$—$WSe_2$ heterostructure yields a new direct Eg electronic structure with >0.6 eV $E_g$ reduction compared to the individual layers. FIG. 3C depicts TMDCs and their heterostructure combinations demonstrating that $WSe_2/WS_2$ and $WSe_2/MoS_2$ provide the most fruitful systems for experimental exploration.

FIG. 4, comprising FIG. 4A through FIG. 4C depicts results of experiments demonstrating the selective growth of $WSe_2$ on sapphire substrates.

FIG. 5, comprising FIG. 5A depicts a schematic Flow diagram of the process for facile templated growth of 2D materials. FIG. 5B depicts the Raman confirmation that a carbonaceous mask layer (CML) is formed in regions where the surface polymer layer was initially defined. The 2D material grows efficiently in regions without the CIVIL, however, nucleation is precluded in those regions with the CIVIL.

FIG. 6, comprising FIG. 6A through FIG. 6F depicts the characterization of sample scanning electron microscopy.

FIG. 7, comprising FIG. 7A depicts a Raman map of $WSe_2$ grown on graphene on silicon carbide, where the $WSe_2$ is only found on the surface fraction with the graphene (ordered carbon) layer. FIG. 7B depicts individual spectra from FIG. 7A showing the signal of $WSe_2$ on and off the graphene layer. FIG. 7C depicts a cross sectional TEM showing the preference for $MoS_2$ to grow on graphene as well. Collectively, this data suggested the presence of a carbon layer would promote the growth of the additional layers, but once the carbon layer became highly disordered, the effect was opposite.

FIG. 10, comprising FIG. 10A depicts a schematic of the utilization of conventional lithographic processing technique process for obtaining different surface functionalizations on a substrate surface. FIG. 10B depicts a schematic of the utilization of physical mask process for obtaining different surface functionalizations on a substrate surface. FIG. 10C depicts scanning electron images showing selective growth on the uncoated regions of the substrate surface. FIG. 10D depicts Raman maps of the $E_{2G}/A_{1G}$ intensity peaks on the selective area samples. FIG. E depicts a graph of Raman intensity peaks showing intensity peaks in the uncoated regions while no peaks are present in the coated regions.

FIG. 11, comprising FIG. 11A depicts the contact angle measurements of the coated and non-coated regions of the substrate surface. FIG. 11B depicts the surface analysis of the non-coated regions of the substrate surface. FIG. 11C depicts a schematic representation of the surface analysis of a clean substrate, non-coated region of the substrate, and coated region of the substrate.

FIG. 12, comprising FIG. 12A depicts a low magnification optical image of selectively grown $MoS_2$ channels across a large substrate area. FIG. 12B depicts results of experiments showing channels are comprised of several large grains coalesced into a continuous film. FIG. 12C depicts the top-gated field effect transistor transfer ($I_{ds}$-$V_{gs}$) curves. FIG. 12D depicts the top-gated field effect transistor output ($I_{ds}$-$V_{ds}$) curves.

FIG. 14, comprising FIG. 14A depicts a 20×25 channel of $MoS_2$ of isolated $MoS_2$ triangles taking the shape of the lithographically defined channel. FIG. 14B depicts a 20×25 μm channel of $MoS_2$ of isolated $MoS_2$ film taking the shape of the lithographically defined channel. FIG. 14C depicts a 20×25 μm channel of $MoS_2$ of isolated $MoS_2$ film taking the shape of the lithographically defined channel. $MoS_2$ growth is stopped exactly at the interface between pristine sapphire and sapphire functionalized with the polymeric layer. FIG. 14D depicts $WSe_2$ synthesized by MOCVD using HDMS and SPR® 3012. FIG. 14E depicts $WSe_2$ synthesized by MOCVD using SPR® 3012. FIG. 14F depicts $WSe_2$ synthesized by MOCVD using LOR5A and SPR® 3012. FIG. 14G depicts $WSe_2$ synthesized by MOCVD using HMDS and 955. FIG. 14H depicts $WSe_2$ synthesized by MOCVD using PMGI SF 2 and SPR®3012. FIG. 14I depicts $WSe_2$ synthesized by MOCVD using Omnicoat™ and SPR® 3012. A higher degree of selectivity is seen when adhesion promoters such as HMDS and Omnicoat™ are used in combination with a higher carbon content resists like SPR® 3012.

FIG. 15, comprising FIG. 15A depicts a $MoS_2$ SEM image. FIG. 15B depicts a $MoS_2$ Raman map. FIG. 15C depicts a $MoS_2$ PL map. FIG. 15D depicts a $WSe_2$ SEM images. FIG. 15E depicts a $WSe_2$ Raman map. FIG. 15F depicts a $WSe_2$ PL map. All characterization techniques shows relatively good uniformity of the material growth within pristine sapphire regions. Scale bars for $MoS_2$ and $WSe_2$ SEM images are 2 microns. Raman and PL maps are 10×10 microns. In this case, the $MoS_2$ sample was simply patterned down the middle, while the $WSe_2$ sample was patterned with 6 micron wide lines across the substrate.

FIG. 16, comprising FIG. 16A through FIG. 16D depicts results of experiments showing high resolution C 1s spectra for polymer functional layers, sapphire surface, and the sapphire surface after growth of $MoS_2$.

DETAILED DESCRIPTION

Figure 1:
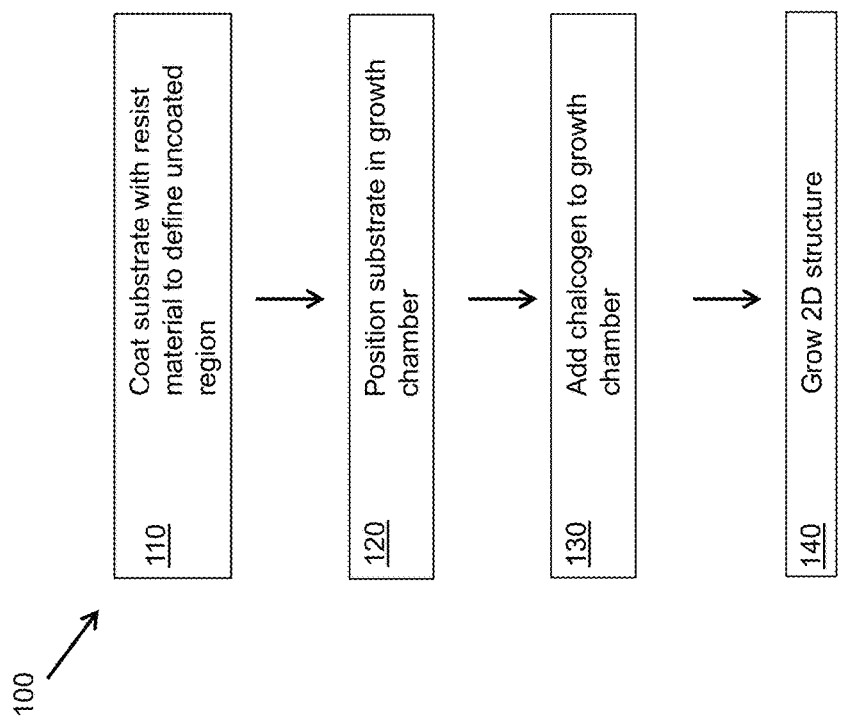
FIG. 1 depicts a flowchart of an exemplary method of fabricating a two-dimensional (2D) structure, wherein the 2D structure growth is limited laterally through templated growth.

The present invention relates to methods for fabricating templated two-dimensional structures, the fabricated two-dimensional structures, and methods of using the same.

In one aspect, the invention provides a method for fabricating a templated two-dimensional structure, wherein the 2D structure growth is limited laterally through templated growth. In one embodiment, the method of the invention includes a method for forming a carbonaceous mask layer on a substrate, wherein the 2D structure grows on the substrate void of the carbonaceous mask layer.

In another aspect, the invention provides a method for controlling the lateral growth of a 2D structure on a substrate, wherein a substrate is patterned with a resist material and a growth of the 2D structure is prohibited at the interface of the uncoated and coated substrate surface.

Definitions

It is to be understood that the figures and descriptions of the present invention have been simplified to illustrate elements that are relevant for a clear understanding of the present invention, while eliminating, for the purpose of clarity, many other elements typically found in the art. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined elsewhere, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

The term "chalcogens," as used herein, refers to chemical elements from the group 16 column of the periodic table, most notably sulfur (S), selenium (Se) and tellurium (Te). According to the present techniques, the chalcogen sources employed are preferably elemental chalcogens which do not contain unwanted impurities, such as carbon, oxygen and halogens.

The term "transition metal" as used herein, refers to chemical elements from the groups 3 through 12 columns of the periodic table, most notably Titanium (Ti), Vanadium (V), Chromium (Cr), Manganese (Mn), Iron (Fe), Cobalt (Co), Nickel (Ni), Copper (Cu), Zinc (Zn), Zirconium (Zr), Niobium (Nb), Molybdenum (Mo), Technetium (Tc), Ruthenium (Ru), Rhodium (Rh), Palladium (Pd), Silver (Ag), Cadmium (Cd), Hafnium (Hf), Tantalum (Ta), Tungsten (W), Rhenium (Re), Osmium (Os), Iridium (Ir), Platinum (Pt), Gold (Au), and Mercury (Hg). According to the present techniques, the transition metal sources employed are preferably elemental transition metal which do not contain unwanted impurities, such as carbon, oxygen and halogens The term "group-III element" as used herein, refers to chemical elements from the group 13 column of the periodic table, most notably Aluminum (Al), Gallium (Ga) and Indium (In). According to the present techniques, the group-III element sources employed are preferably elemental which do not contain unwanted impurities, such as carbon, oxygen and halogens The term "group-IV element" as used herein, refers to chemical elements from the group 14 column of the periodic table, most notably Silicon (Si), Germanium (Ge) and Tin (Sn). According to the present techniques, the group-IV element sources employed are preferably elemental which do not contain unwanted impurities, such as carbon, oxygen and halogens The term "mask," as used herein, means any appropriate precludes growth on a portion of a substrate. According to some embodiments, masking structures may be comprised of a polymer layer such as ultraviolet liography a photoresist or e-beam lithography resist.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6, and any whole and partial increments there between. This applies regardless of the breadth of the range.

As used herein, the term "about" is understood by persons of ordinary skill in the art and varies to some extent on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

Spatially relative terms, such as "beneath", "below", "lower", "underneath", "above", "upper", "upstream", "downstream", and the like, may be used herein for ease of description to describe one element or feature's relationship to another element(s) or feature(s) as presented herein. It will be understood that the spatially relative terms are intended to encompass different orientations of the components in use or operation in addition to the orientation depicted in the figures. For example, if a component is turned over, elements described as "below" or "beneath" other elements or features would then be oriented "above" the other elements or features. The terms "upstream" and "downstream" denote spatial orientation relative to a fluid stream, such as a liquid or a gas, wherein elements described as "upstream" are closer to the fluid source and elements described as "downstream" are further away from the fluid source.

Fabrication of Two-Dimensional Structures

In one aspect, the invention provides methodology for fabricating a two-dimensional (2D) structure, wherein the 2D structure growth is limited laterally through templated growth. For example, as shown in FIG. 1, method 100 is a method of fabricating a two-dimensional structure, including the steps of coating a substrate with a resist material to define an uncoated region 110, positioning substrate in growth chamber 120, adding chalcogen to growth chamber 130, and growing 2D structure 140.

In one embodiment, the method of fabricating a two-dimensional structure comprises coating a portion of a substrate with a resist material to define an uncoated region of the substrate surface; positioning the substrate in a growth chamber; adding a chalcogen-based material to the growth chamber; and growing a two-dimensional structure on the substrate, wherein the growth of the two dimensional structure is limited to the uncoated region of the substrate surface.

Coating a Substrate Surface to Define an Uncoated Region

In one embodiment the substrate can be, but is not limited to, sapphire, silicon, silicon carbide, silicon dioxide, graphene, graphite, non-alkali glass, poly-silicon carbide, quartz, and poly-silicon.

In one embodiment, the resist material is a photoresist. In one embodiment, the resist material includes, but is not limited to, an optical photoresist, a lift-off bilayer resist stack, or an e-beam photoresist. In one embodiment the optical photoresist includes, but is not limited to, standard commercial resists such as SPR3012 and SPR995. In one embodiment the lift-off bilayer resist stack includes, but is not limited to, standard commercial resists such as PMGI/LOR 3102/955. In one embodiment the e-beam photoresist includes, but is not limited to, standard commercial resists such as ZEP520A and Anisole. In certain embodiments, the e-beam photoresists comprises standard commercial resists such as PMMA/MMA stacks and ratios of ZEP520A and Anisole, wherein the ratio of ZEP520A:Anisole can range from 1:0 to 1:1.

In one embodiment, coating a portion of a substrate further comprises coating the substrate with a resist material; and patterning the resist material to expose the uncoated region of the substrate surface In one embodiment, patterning the resist material to expose the uncoated region of the substrate surface comprises exposing the substrate to a UV light through a mask pattern, developing exposed resist material, exposing the substrate to a descum etch and exposing the substrate to a photoresist remover. In one embodiment, the descum etch is an $O_2$/He descum etch. In one embodiment, the developing solution is MICROPOSIT™ MF™ CD-26 Developer developing solution.

Methodologies of patterning resist materials on a substrate are well known in the art, for example, those described in del Campo et al. (2008, Chem Rev 108:911-45) and Nie and Kumacheva (2008, Nat Mater 7:277-290). In some embodiments, methodologies of defining a region of growth include photolithography, bar-coater stenciling, electron beam lithography, spray deposition using physical masks, and spray stenciling Descum etching is well known in the field of photolithography. This etching process, usually embodied by a common plasma-based etching process, exposes and cleans the surface of the substrate not covered by the photoresist mask by removal of residual resist (scum). In a subsequent step, the de-scummed substrate and remaining photoresist mask is used in conjunction with plasma etching to selectively remove the areas exposed through the mask openings. A subsequent step also encompasses additive fabrication steps such as deposition and growth, in which case the descum etching is used to remove residual photoresist in exposed regions in order to improve the interface between substrate and deposited material The shape or pattern made by patterning on the substrate surface is not particularly limited. The shapes may include, but are not limited to, geometric shapes such as lines, circles, stripes, triangles, and rectangles, and abstract shapes.

Chalcogen Materials

The 2D structure can be fabricated from a variety of materials. In some embodiments, the 2D structure is a chalcogen-based material. In some embodiments the chalcogen-based material is a chalcogen element and a second element selected from the group consisting of a transition metal, a group-III element, a group IV element, and any combination thereof. In other embodiments, the chalcogen-based material includes, but is not limited to, $WSe_2$, $WS_2$, $MoSe_2$, and $MoS_2$, or any combination thereof. Other 2D layers include, but art not limited to monoelemental layers such as silicone, phosphorene, germanene, other non-chalcogen-based layers such as MXenes, MAXenes, graphene, group-III nitrides, group-III arsinides, or any other material capable of being deposited via chemical processes Growing a 2D Structure In one aspect, the invention includes the growing 2D structures. Methods for synthesizing or growing 2D structures are well known in the art, for example those described in Das et al., (2015, Annu Rev Mater Res 45:1-27).

In one embodiment, growing a two dimensional structure uses a methodology including, but not limited to, powder vaporization, metal-organic chemical vapor deposition, molecular beam epitaxy, inorganic chemical vapor deposition, and metal-chloride vaporization.

In one embodiment, growing a two dimensional structure comprises the steps placing a substrate in a furnace, introducing a flow of gas into the furnace at a flow rate, heating the furnace to at least one temperature of about 500° C. and holding for at least one period of time of about 3 to 50 minutes, subsequently introducing at least one chalcogen element and at least one second element selected from the group consisting of a transition metal, a group-III element, a group IV element, and maintaining a furnace pressure between 100 and 700 torr and for at least one period of time of about 5 minutes to about 24 hours, and equilibrating the furnace temperature to room temperature.

In some embodiments, the total gas flow rate is between about 1 and 2000 sccm. In certain embodiments, the gas flow rates through metal-organic precursors are between about 0.01 and 1000 sccm.

In one embodiment, the gas is a mixture of $N_2$ and $H_2$. In some embodiments the gas is pure $H_2$. In other embodiments the mixture of $N_2$ and $H_2$ is about 1 to 99% $H_2$.

In one embodiment, growing a 2D structure is achieved through metal-oxide and chalcogen powder vaporization or vaporization of metal-chlorides.

In some embodiments, the 2D structure is synthesized through vapor deposition of metal-organics and metal-chlorides combined with wide ranges of chalcogen precursors. In one embodiment the metal-organic may be $W(CO)_6$ or $Mo(CO)_6$. In another embodiment, the metal-chloride may be $MoCl_5$, $WCl_5$, $WOCl_5$, or $VOCl_5$. In yet another embodiment, the chalcogen precursor is $H_2S$, $HS(CH_2)_2SH$, $HSC(CH_3)_3$, $H_2Se$, diethyl selenide, or di-tert-butylselenide).

In certain embodiments, the 2D structure is synthesized through powder vaporization of a metal-oxide and chalcogen. In some embodiments the metal oxide is $MoO_3$ or $WO_3$. In other embodiments the chalcogen is S or Se.

In certain embodiments, the powder vaporization utilizes a horizontal tube furnace, where the chalcogen powder is placed upstream of the hot zone, and just outside the portion of the tube encompassed by furnace heating coils. Additionally, a crucible with metal-oxide (M-O) powder is placed in the hot-zone of the furnace, and sample substrates are placed downstream of the M-O crucible or face-down directly on top of the M-O crucible. Upon heating, the metal-oxide and chalcogen powders are vaporized and transported downstream in the furnace, coating the substrate material and forming $MX_2$.

Controlling Lateral Growth of a Two Dimensional Structure

In some aspects, the invention is based, in part, on the discovery that 2D growth selectivity is due to increased C—C and C=O bonding in the coated regions which precludes the growth of 2D structures. Thus the invention provides a method of controlling the lateral growth of a two dimensional structure.

Figure 2:
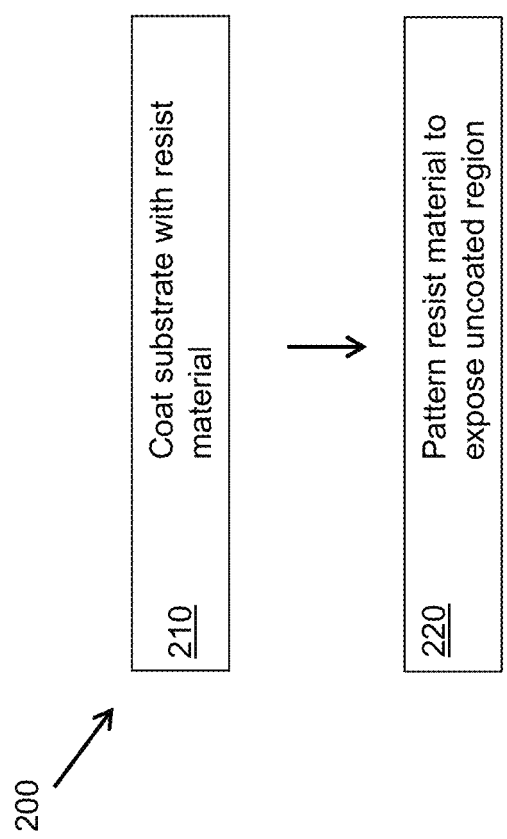
FIG. 2 depicts a flowchart of an exemplary method of controlling lateral growth of a two-dimensional structure on a substrate surface.

In one aspect, the invention provides methodology for controlling lateral growth of a two-dimensional structure on a substrate surface. For example, as shown in FIG. 2, method 200 is a method of controlling lateral growth of a two-dimensional structure on a substrate surface including the steps of coating the substrate with a resist material 210, and patterning resist material to expose an uncoated region 220.

In one embodiment, the method of controlling lateral growth of a two-dimensional structure on a substrate surface comprises coating a portion of a substrate surface with a resist material to define an uncoated region of the substrate surface, and growing a two-dimensional structure on the uncoated region of the substrate surface, wherein lateral growth of the two dimensional structure is prohibited at the interface of the uncoated and coated substrate surface.

Suitable resist materials, substrates, and methods of growing 2D structures are described elsewhere herein.

In one embodiment, coating a portion of a substrate further comprises coating the substrate with a resist material, and patterning the resist material to expose the uncoated region of the substrate surface. In one embodiment, the method of controlling lateral growth of a two-dimensional structure on a substrate surface comprises coating the substrate with a resist material, exposing an at least one section of the substrate to a UV light, exposing the substrate to a developing solution, exposing the substrate to a plasma etch, and exposing the substrate to a chemical wash to expose the uncoated region of the substrate surface. In another embodiment, the chemical wash is a photoresist remover wash.

The plasma etch and chemical wash create a thin resist layer on the substrate surface that was not exposed to the UV light. The substrate is placed in a growth chamber where the coated region of the substrate is converted to a carbonaceous mask layer. Two-dimensional structures are unable to nucleate and grow on the carbonaceous mask, thus the two-dimensional structure growth is laterally controlled to areas void of the carbonaceous mask.

In one embodiment, the templated growth is carried out by electron beam lithography, as opposed to photolithography, in which the resist is electron beam sensitive. In this case, the process is similar in methodology to the photolithography process except different resists and developer solutions are used. In the case of electron beam lithography, patterns are exposed and formed in a direct-write process by the electron beam which is rastered across the sample, as opposed to the optical lithography process in which a physical photomask is used during exposure.

Applications of Templated Growth of 2D Structures

In some embodiments, the invention provides devices comprising a two-dimensional structure produced by the methods of the invention.

In one embodiment, the device includes, but is not limited to, a p/n semiconductor junction (diodes, light emitting diodes and photovoltaics) and a top-gated field effect transistor.

In some embodiments, 2D templated structures produced by the method of the invention are used in p/n semiconductor junctions. In some embodiments the p/n semiconductor is generated by growing a first layer comprising p-type 2D semiconductor in growth areas comprised of straight lines and growing a second layer above the first layer, the second layer comprising an n-type 2D semiconductor in growth areas comprised of straight lines perpendicular to the straight lines of the first layer. In some embodiments the p-type 2D semiconductor is $WSe_2$. In other embodiments the n-type 2D semiconductor is $MoS_2$.

In some embodiments, 2D templated structures produced by the method of the invention are used in top-gated field effect transistors.

In some embodiments, the 2D structure is electronically decoupled from the substrate on which it was grown. In one embodiment, decoupling of the 2D structure comprises submerging the 2D structure on the substrate in a liquid nitrogen bath for about 15 minutes.

The use of templated growth to form 2D structures provides multiple advantages in the production of devices. For example, it eliminates the need for a complicated transfer process which can introduce mechanical defects or cause unintentional doping, consequences often encountered in graphene synthesis and device fabrication.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art may, using the preceding description and the following illustrative examples, make and utilize the compounds of the present invention and practice the claimed methods. The following working examples therefore, specifically point out the preferred embodiments of the present invention, and are not to be construed as limiting in any way the remainder of the disclosure.

Figures 3A, 3B, 3C:
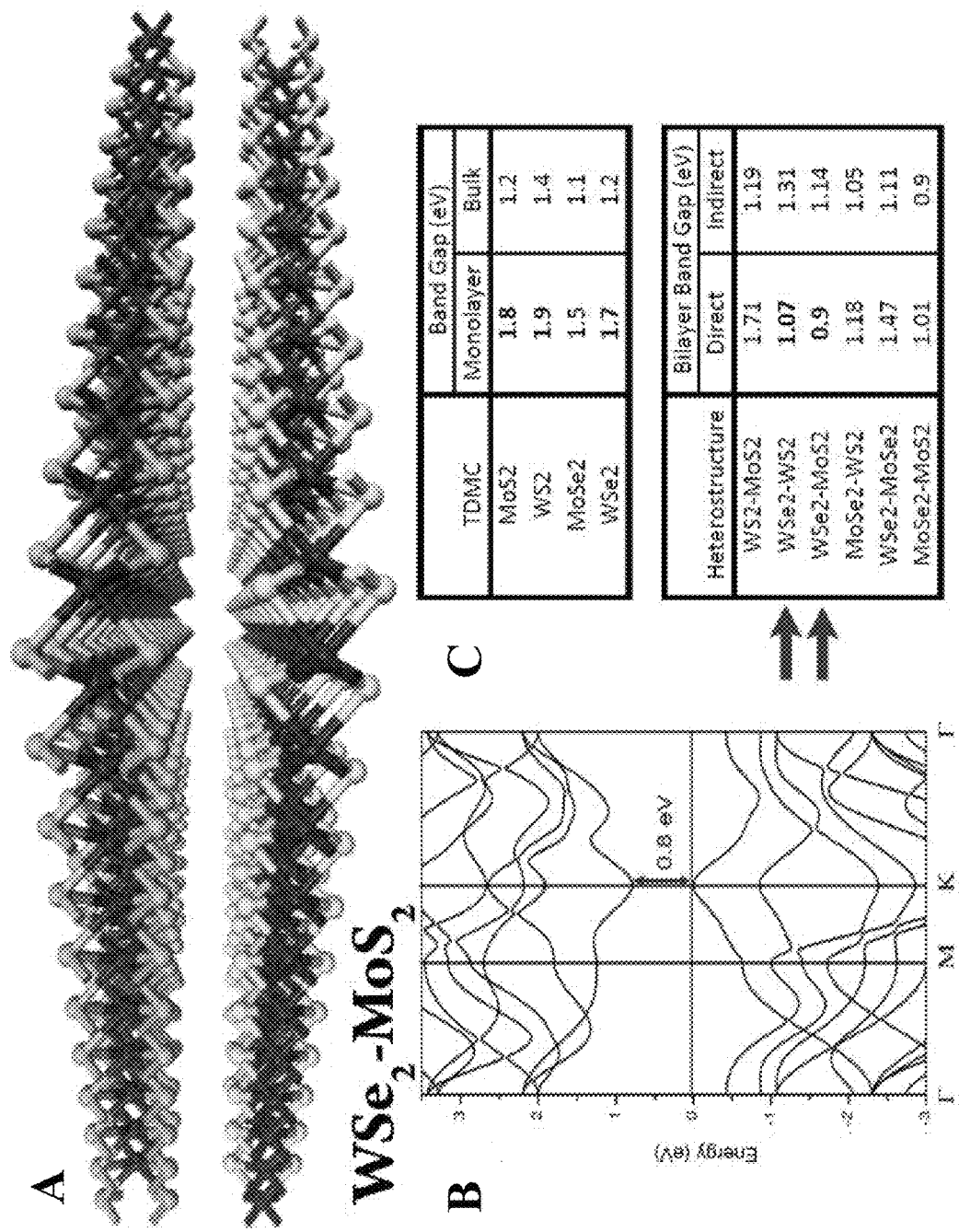
FIG. 3A through FIG. 3C, depicts heterogeneous integration of layered materials.

Example 1: Facile Route to Templated Growth of Two-Dimensional and Layered Materials Heterogeneous integration of layered materials has been predicted to lead to completely new electronic properties (FIG. 3), resulting in novel electronic material entirely different from the constituent layers. Developing routes for templated growth will significantly enhance the ability to tune the electronic properties of these 2D materials. In spite of the predicted extraordinary properties of 2D nanoribbons, bottom-up template synthesis processes have been quite limited. Described herein is a novel method for bottom-up template synthesis of 2D materials.

Roughening of Substrate Surface does not Allow for Selective Growth

It was hypothesized that roughening of a substrate surface will enhance nucleation and growth rate of the layered material in those regions where the roughness is increased, thereby providing a means to grow in pre-patterned areas. To test this hypothesis, it was determined if one could selectively grow the $WSe_2$ in etched areas of sapphire preferentially compared to regions that were unetched. The initial work focused on patterning a sapphire substrate with standard UV lithography techniques and subsequently etching the sapphire with a reactive ion etch. This process typically resulted in no selective growth, except on one occasion where selective growth of $WSe_2$ in the etched area was observed. Following the initial results, there were many attempts to reproduce the selective growth after etching; however, none were successful.

Subsequent experiments identified that two samples not having an $O_2$ ash showed selectivity for $WSe_2$ growth while samples having an $O_2$ ash did not show selectivity for $WSe_2$ growth. This suggested that substrate etching was not important, but rather an ultra-thin polymer layer left behind during one of the processing steps that precluded the $WSe_2$ growth. Therefore, it was then hypothesized that utilization of an ultra-thin polymer layer on the surface of a substrate will preclude the nucleation of the desired 2D material in the locations where the polymer exists, thereby providing a means to confine growth to regions void of the polymer surface layer.

To test this hypothesis, substrate was treated with an ultrathin polymer layer and part of the substrate was clean. The 2D material was able to only grow in those regions where the polymer surface layer (PSL) was not present.

Generalized Process for Making Template

Figures 4A, 4B, 4C:
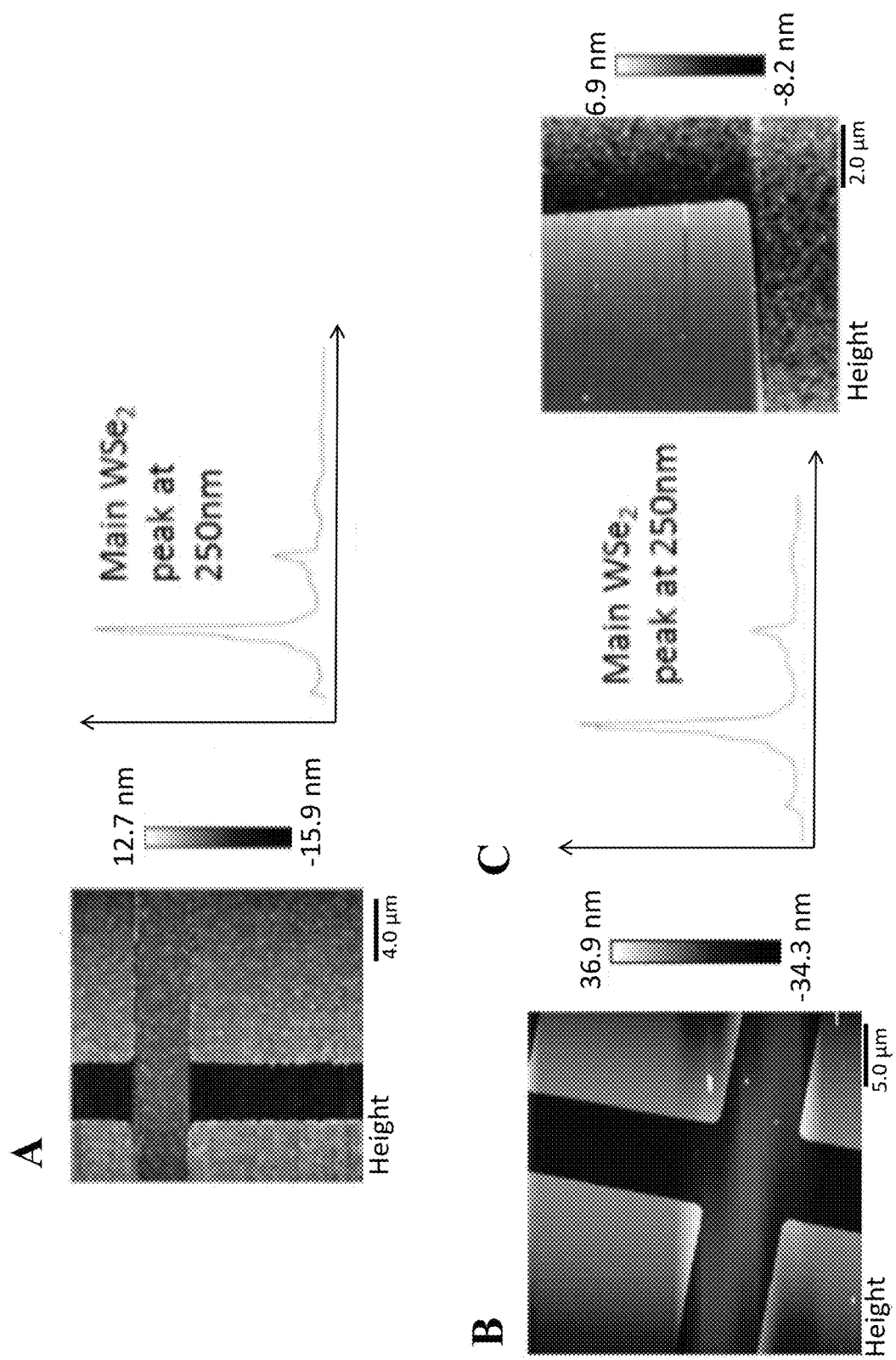
FIG. 4A depicts non-selective growth of $WSe_2$ on a sapphire substrate.
FIG. 4B depicts lithography etch patterns on a sapphire substrate.
FIG. 4C depicts selective growth of $WSe_2$ on a sapphire substrate.
Figure 5A:
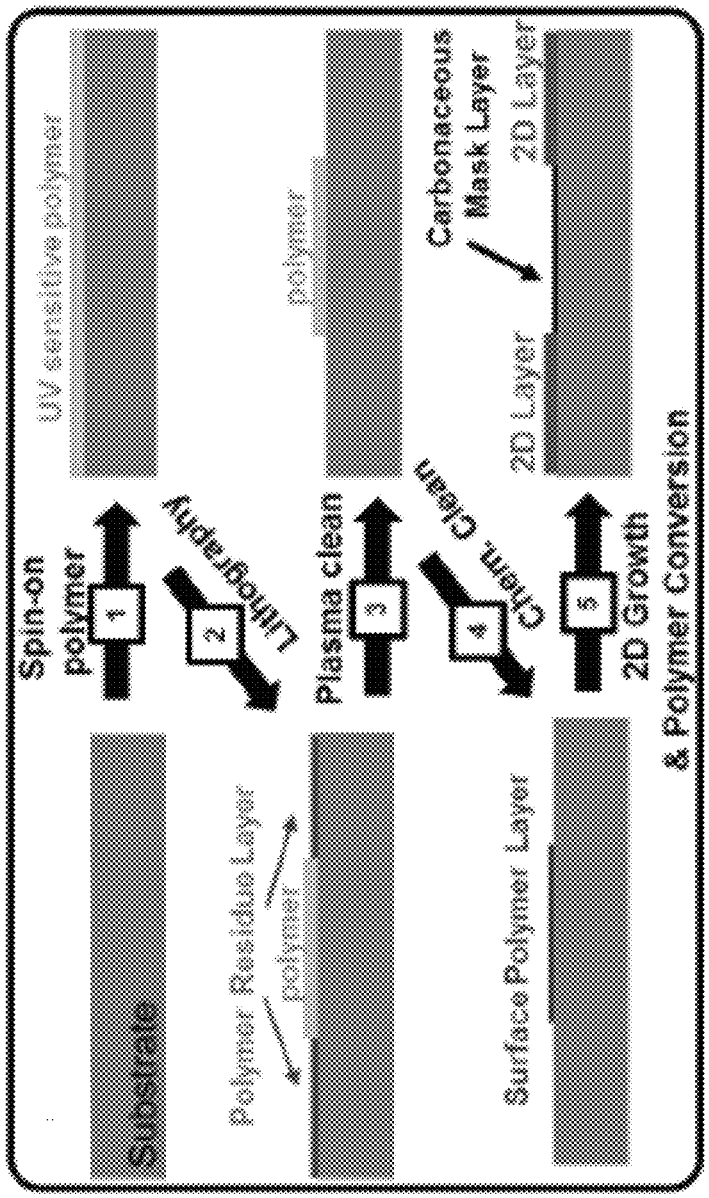
FIG. 5A and FIG. 5B, depicts methodology for the process for facile template growth of 2D materials.

The templated growth of 2D materials begins with tailoring the surface of the substrate that growth will be performed. In this work, substrates are initially treated with hexamethyldisilazane (HMDS) to promote adhesion of the polymer layer to the underlying substrate, which is subsequently coated with a novolak-based, ultraviolet (UV) light sensitive polymer (FIG. 5a, Step 1). Next, photolithography techniques are used to define regions of growth. Regions exposed to the UV light are removed following a rinse in a tetramethyl ammonium hydroxide-based (TMAH) developing solution (FIG. 5a, Step 2). Subsequently, the substrate with polymer masking is exposed to an oxygen/helium plasma to remove any residual polymer in those regions exposed to the UV light (FIG. 5a, Step 3), which is followed by a chemical cleaned using organic solvents (FIG. 5a, Step 4). This process does not remove 100% of the polymer from the surface of the substrate, instead a thin polymer layer remains—referred to as a surface polymer layer (SPL), and is the basis for masking the areas during synthesis of the 2D materials. Finally, the sample is placed into the 2D growth furnace, where the surface polymer layer is converted to a carbonaceous mask layer (CIVIL) during the 2D layer growth (FIG. 5a, Step 5). Raman confirms the formation of a nanocrystalline graphitic (carbonaceous) layer (FIG. 4b) where the SPL was defined.

Example of Templated Growth with Tungsten Diselenide

Tungsten selenide was synthesized using tungsten hexacarbonyl (Sigma-Aldrich 99.99%) and dimethylselenium precursors (SAFC (99.99%) or STREM Chemical (99%)) in a vertical cold wall reactor with an induction heated susceptor as described previously (Eichfeld et al., 2015, ACS Nano 9:2080-7). The precursors were transported into the system via a bubbler manifold allowing for independent control over each precursor concentration. The carrier gas included $H_2/N_2$ mixtures with 100% $H_2$ being optimal. The samples were heated to 500° C. at 80° C./min and annealed for 15 min to drive off any water vapor. Samples were then heated to growth temperatures ranging from 600 to 900° C. at 80° C./min. Upon reaching growth temperature the tungsten hexacaronyl and dimethylselenium were introduced into the reaction chamber. Growth took place at total pressures from 100 to 700 Torr and growth times were 30 min. The Se and W concentrations were varied by changing the $H_2$ carrier gas flow rate from 5 to 35 sccm at bubbler pressures of 760 Torr for Se and 700 Torr for W and both bubblers were maintained at a temperature of 23° C. Samples were cooled to room temperature after the growth step was complete.

Figures 6A, 6B, 6C, 6D, 6E, 6F:
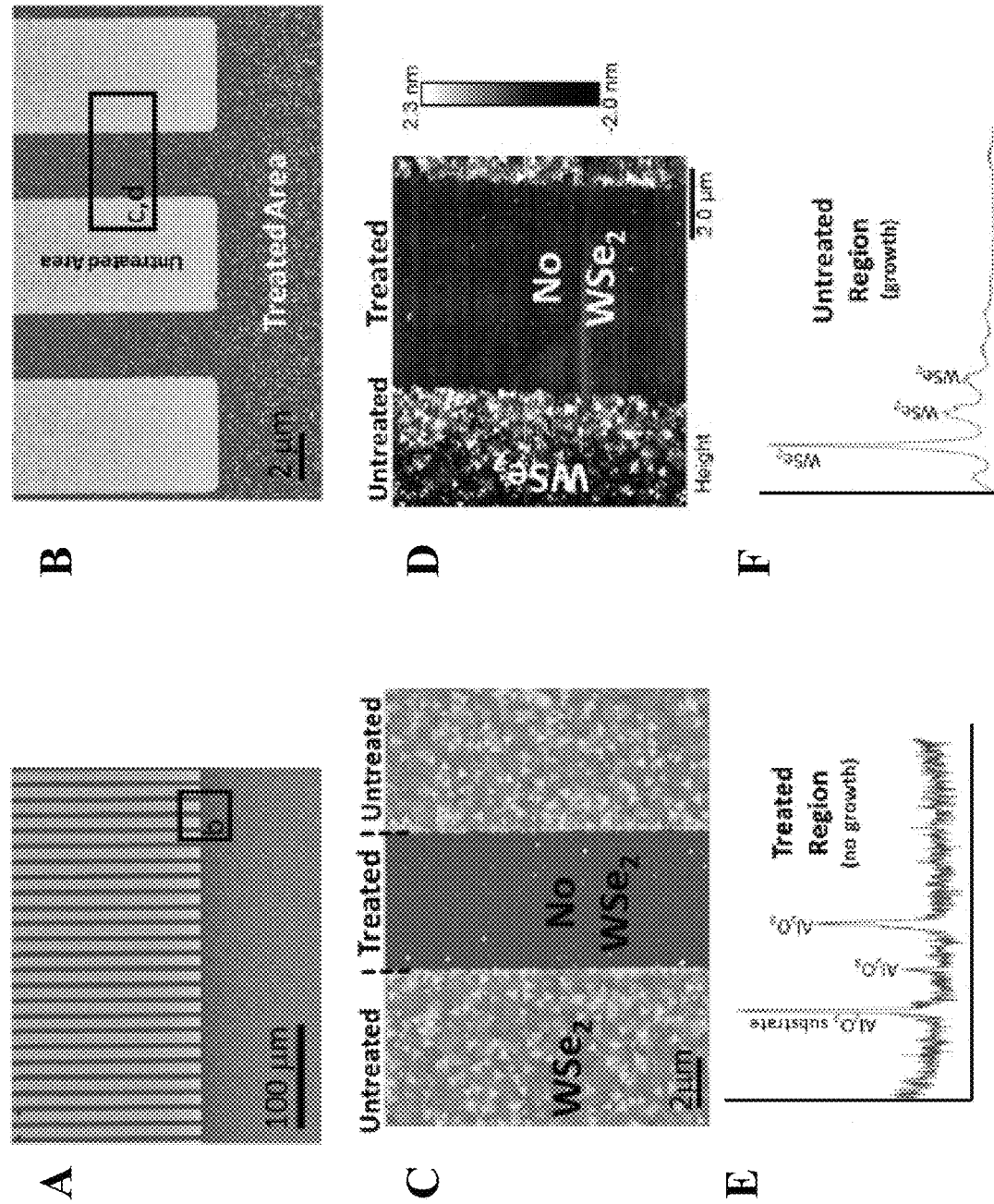
FIG. 6A is scanning electron microscopy image depicting selective area growth of $WSe_2$ on a sapphire substrate that has been selectively treated with the cresol novolak-based polymer and subsequently grown on via molecular organic chemical vapor deposition (MOCVD).
FIG. 6B is a higher magnification scanning electron microscopy image of the sample shown in FIG. 6A depicting selective area growth of $WSe_2$ on a sapphire substrate.
FIG. 6C is a higher magnification scanning electron microscopy image of the sample shown in FIG. 6A and FIG. 6B depicting selective area growth of $WSe_2$ on a sapphire substrate.
FIG. 6D depicts the significant reduction in nucleation and growth of $WSe_2$ in the treated regions of the sample.
FIG. 6E depicts the Raman spectroscopy of the treated region showing no $WSe_2$ growth.
FIG. 6F depicts the Raman spectroscopy of the untreated region showing selective $WSe_2$ growth.

For the templated growth, substrates are initially treated with hexamethyldisilazane (HMDS) to promote adhesion of the polymer layer to the underlying substrate, which is subsequently coated with a Microchem SPR 3012®. Next, photolithography techniques are used to define regions the regions of growth. Regions exposed to the UV light are removed following a rinse in a CD26® developing solution. Subsequently, the substrate with polymer masking is exposed to an oxygen/helium plasma to remove any residual polymer in those regions exposed to the UV light, which is followed by a soak in acetone and PRS3000, followed by a rinse in isopropyl alcohol, and deionized water. This process does not remove 100% of the polymer from the surface of the substrate, instead a thin layer of the SPR3012 remains, which is converted to the carbonaceous mask layer (CIVIL) during the $WSe_2$ layer growth. Raman confirms the formation of the nanocrystalline graphitic (carbonaceous) layer where the SPL was defined. Regions with the CIVIL (treated area) preclude nucleation of the 2D layer, thereby promoting selective growth in regions (nontreated area) cleaned by the developer solution plasma etch. Proof that this process results in a selective area growth is apparent in scanning electron microscopy (SEM) and atomic force microscopy (AFM) (FIG. 6a-d). This is subsequently confirmed using Raman spectroscopy (FIG. 6e,f), where treated regions do not exhibit the characteristic tungsten diselenide ($WSe_2$) signature (FIG. 6e). On the other hand, those regions that are clear of the CIVIL have a strong $WSe_2$ Raman signature (FIG. 6f). Interestingly, even though the films grown in this case were not monolayer, there appears to be no lateral overgrowth of the 2D layers from the treated to non-treated region.

Figures 7A, 7B, 7C:
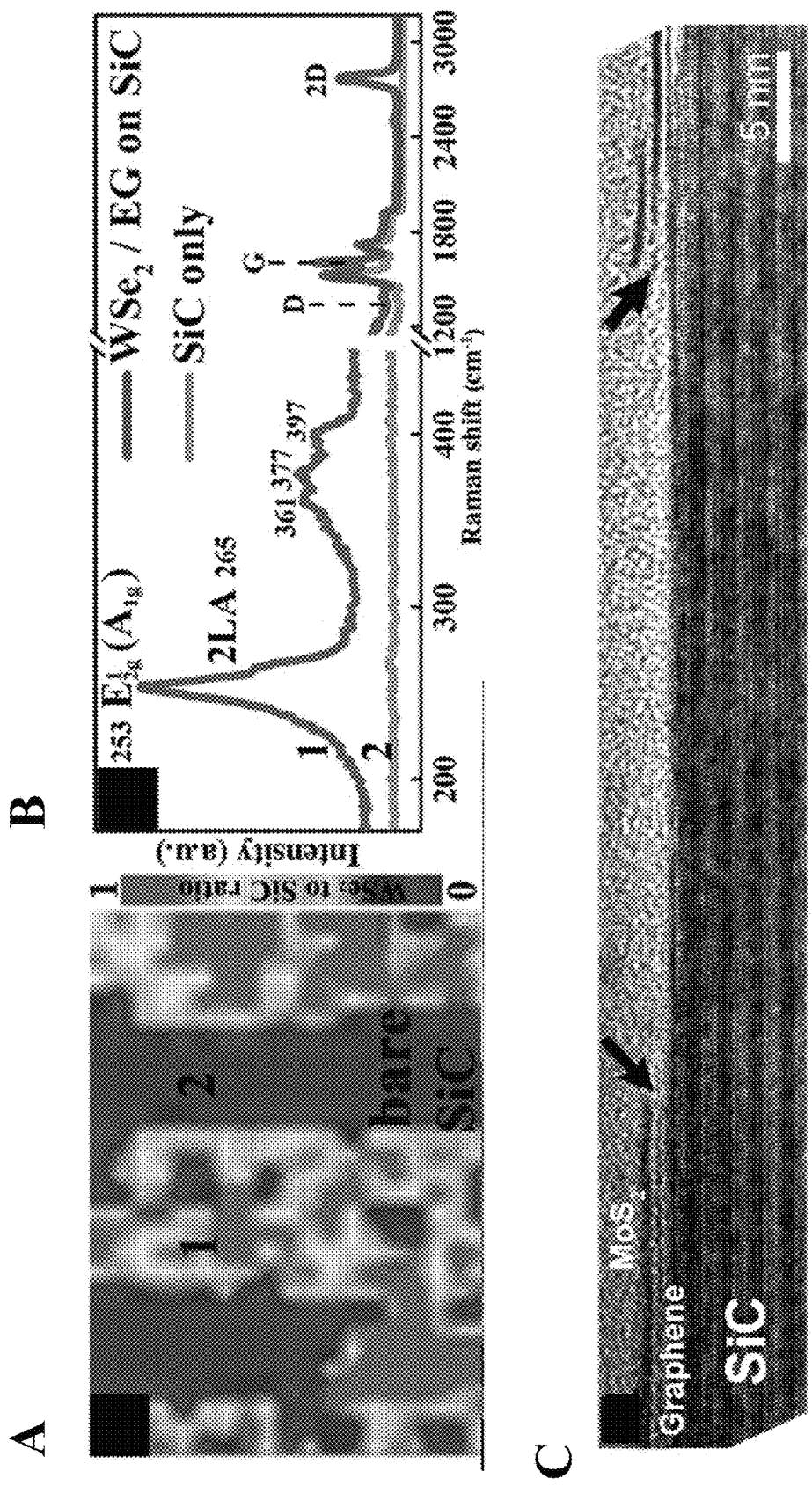
FIG. 7A through FIG. 7C, depicts experimental results showing $WSe_2$ prefers to grow on regions of the substrate where graphene is located.

Previous work indicated that the growth of non-carbon 2D layers preferred growth on graphene (ordered carbon) over that of the underlying substrate. This is evidenced in FIG. 7, which shows that $WSe_2$ prefers to grow on regions of the substrate where graphene is located, but where only bare silicon carbide (SiC) substrate is present, no growth occurs. FIG. 7a is a Raman spectroscopy map of $WSe_2$ grown on ordered carbon (graphene) which compares the signal strength of $WSe_2$ to that of the underlying substrate SiC. Evident in FIG. 7a, and confirmed in FIG. 7b with individual spera, is that only where the graphene is located (evidenced by the "2D" peak in 5b) does the $WSe_2$ grow. Additionally, this is true for another 2D layer: molybdenum disulfide ($MoS_2$). FIG. 7c is a cross sectional TEM image directly showing that the $MoS_2$ stops growing as soon as the graphene underneath stops. Therefore, all evidence up to the point of the discovery suggested that graphene (ordered carbon layers a few nanometers thick) could promote the synthesis of these layers. It wasn't until there was a highly disordered carbon layer that selective growth was seen where the carbon precluded nucleation and growth.

Polymer for a Broad Variety of Layered Materials

In the example of $WSe_2$ on sapphire discussed above, a specific layer combination of HMDS/SPR3012 was used to show the potential for selective growth of 2D materials on a sapphire substrate. This polymer layer combination is not unique. HMDS is an adhesion promoter for polymer films, and may have residual carbon remaining as well, however, this technique works without HMDS, using only SPR2013. This suggests that any polymer layer that can convert to a disordered carbon layer may be used for this technique. Patterning of the polymer layer may not be limited to photolithography either. The lithography may be done in any form, such as bar-coater stenciling, electron beam lithography, spray deposition using physical masks or spray stenciling. Any method that can deposit and pattern the polymer will work.

Expansion of Process for Broad Variety of Layered Materials

Figure 8:
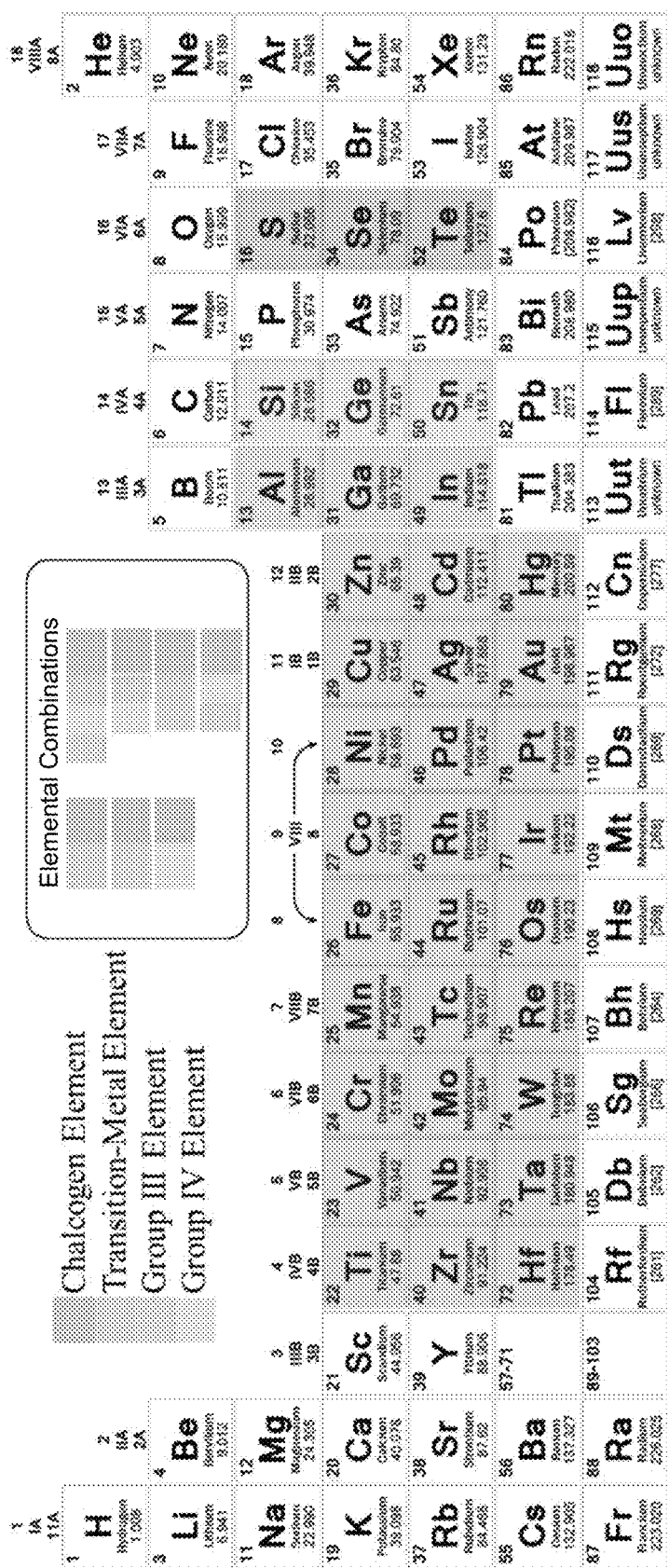
FIG. 8 is an image of the periodic table highlighting combinations of transition metals (blue), group III elements (green), and group IV elements (yellow) with chalcogen elements (red) that are considered layered materials and therefore may be used for the application of the templated growth process.

There are at least 99 combinations of mono- and dichalcogenide materials and hundreds of chalcogen-based alloys that this process may be applicable. The material combinations are highlighted in FIG. 8, and include the combination of a transition-metal (noted "TM") element (FIG. 8, blue coloring), a group-III (noted "III") element (FIG. 8, green coloring), or a group IV (noted "IV") element (FIG. 8, yellow), or any combination of these three element families with a chalcogen (noted "C") element (FIG. 8, red) to form a layered material similar in structure to the $WSe_2$ example presented above. III, IV, and TM elements may be combined with C elements in a variety of forms, for example: TM-C, IV-C, TM-III-IV-C, TM-IV-C, TM-III-C, and III-IV-C.

Routes of Synthesis Compatible with Proposed Templating Technique.

Figure 5B:
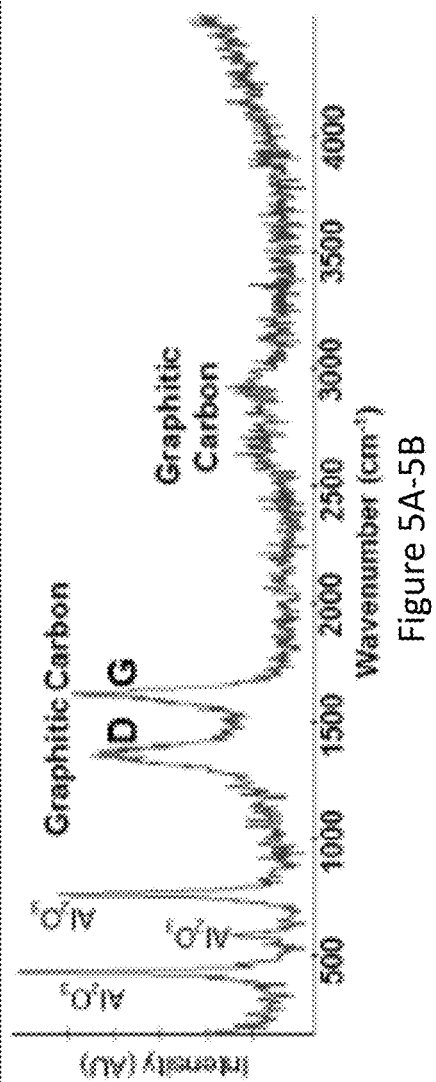

Chemical vapor deposition (FIG. 5) of TMDs has been successful with a variety of metal-organics ($W(CO)_6$, $Mo(CO)_6$, etc.) (Boschner et al., 2007, Appl Surf Sci 253: 6041-6; Chung et al., 1998, J Cryst Growth 186:137-50; Hofmann et al., 1998, J Mater Sci 23:3981-6) and metal-chlorides ($MoCl_5$, $WCl_5$, $WOCl_5$, $VOCl_5$) (Boschner et al., 2007, Appl Surf Sci 253:6041-6; Boschner et al., 2006, Chem Vap Depos 12:692-8; Carmalt et al., 2003, Polyhedron 22:1499-505; Imanishi, 1992, J Electrochem Soc 139:2082; Yu et al., 2013, Sci Rep 3:1866) combined with wide range of chalcogen precursors ($H_2S$, $HS(CH_2)_2SH$, $HSC(CH_3)_3$, diethyl selenide, di-tert-butylselenide) (Boschner et al., 2007, Appl Surf Sci 253:6041-6; Chung et al., 1998, J Cryst Growth 186:137-50; Hofmann et al., 1998, J Mater Sci 23:3981-6; Boschner et al., 2006, Chem Vap Depos 12:692-8; Carmalt et al., 2003, Polyhedron 22:1499-505; Imanishi, 1992, J Electrochem Soc 139:2082). Each of these processes, while not refined to synthesize atomically thin layers, provide important insight into precursor chemistries suitable for monolayer TMD synthesis. Recently, the synthesis of $WSe_2$ has been optimized to achieve monolayer (Eichfeld et al., 2015, ACS Nano 9:2080-7), proving that the above discussed techniques can have monolayer thickness control, and be directly compatible with the templated synthesis process. Additionally, utilization of metal-oxide ($MoO3$, $WO3$, etc.) and chalcogen (S, Se) powder vaporization can be used to form the 2D layers (Yu et al., 2013, Sci Rep 3:1866; Gutierrez et al., 2013, Nano Lett 13:3447-54; Lin et al., 2012, Nanoscale 4:6637). These processes typically utilize a horizontal tube furnace, where the chalcogen powder is placed upstream of the hot zone, and just outside the tube furnace. Additionally, a crucible with metal-oxide (M-O) powder is placed in the hot-zone of the furnace, and sample substrates are placed downstream of the M-O crucible or face-down directly on top of the M-O crucible. Upon heating, the metal-oxide and chalcogen powders are vaporized and transported downstream in the furnace, coating the substrate material and forming $MX_2$. Alternatively, vaporization of metal-chlorides ($MoCl_5$) can also be utilized to synthesize TMDs such as $MoS_2$, though the domain size appears to be smaller than those grown via oxide-vaporization (Yu et al., 2013, Sci Rep 3:1866). In general, powder vaporization techniques are very successful at achieving monolayer and few layer TMD films over large areas; however, the process has little control over vaporization rates of the constituent powders, and often results in a gradient of TMD properties. For instance, regions near the M-O powder are typically bulk films with excess M-O deposition, with a linear progression toward monolayer films downstream of the M-O powder that ultimately end in discontinuous $MX_2$ triangles.

Technology Impact: "On-Demand" p/n Junctions.

Figure 9:
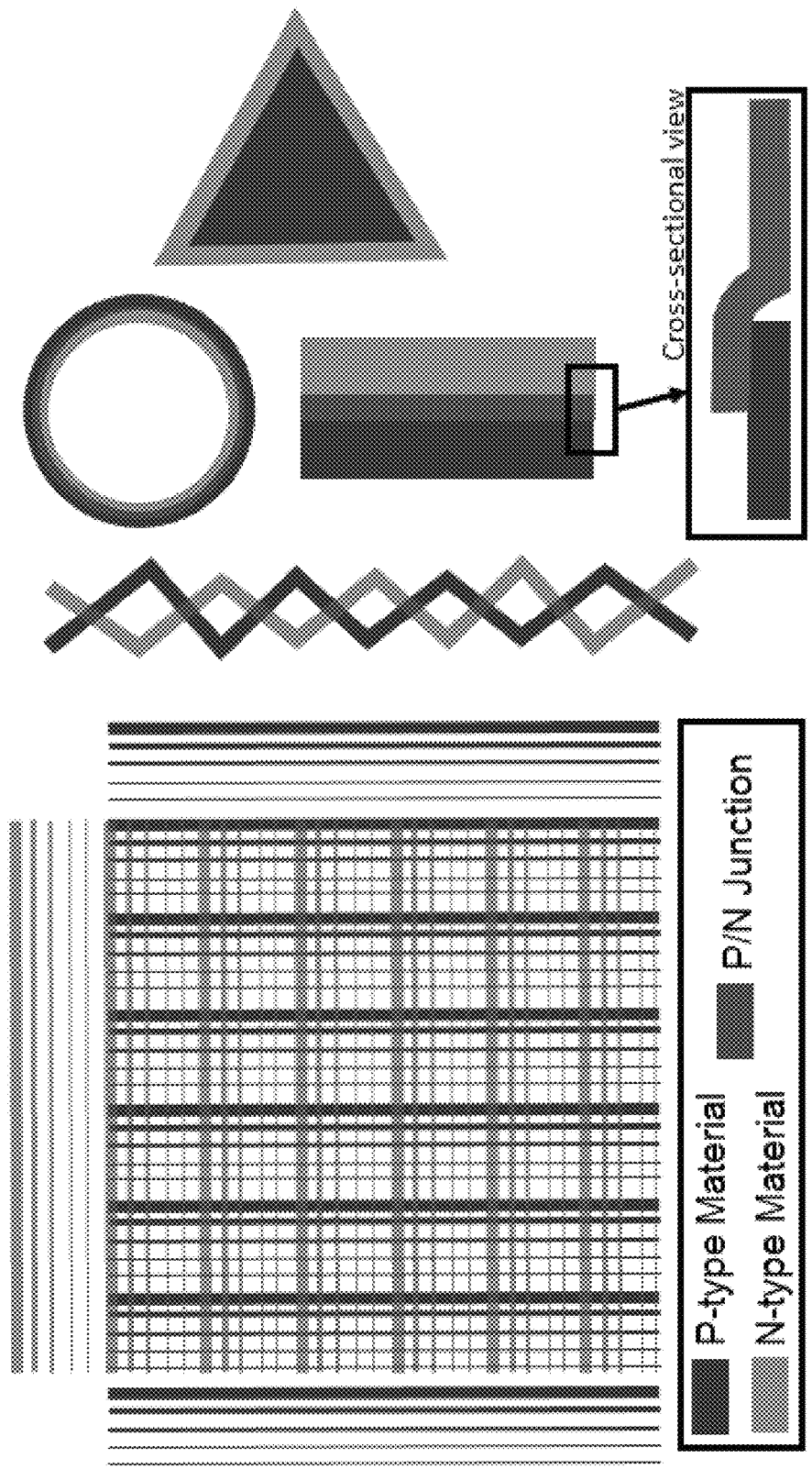
FIG. 9 is a schematic diagram of the simplest concepts of an "on-demand" p/n junction. This general technique may be expanded to significantly more layers based on the need of the application.

The development of a templated growth process for 2D materials could lead to a wide variety of applications, which includes many that have not been predicted to-date. However, there are some high impact applications that this discovery could enable. One specific example is the direct growth of p/n semiconductor junctions "on-demand". This concept is illustrated in its simplest form in FIG. 9, which schematically shows the ability to create p/n junctions by first selectively growing a p-type 2D semiconductor (i.e. $WSe_2$) followed by a second step involving the lateral growth of an n-type 2D semiconductor (i.e. $MoS_2$) in perpendicular rows overtop the first layer. This will generate a pixelated p/n junction array. The importance of the p/n junction in 2D materials has been demonstrated multiple times via mechanical exfoliation techniques, which demonstrate that new optoelectronic properties result from stacking an n-type and p-type 2D layered material (Fang et al., 2014, PNAS 111:6198-202; Lee et al., 2014, Nat Nanotechnol 9:676-81; Roy et al., 2015, ACS Nano 9:2071-9; Roy et al., 2014, ACS Nano 8:6259-64).

Example 2: Selected Area Growth of Two-Dimensional Materials

The data presented herein demonstrates the ability to selectively synthesize TMDs via substrate surface functionalization. These data experimentally demonstrate the robust templated growth of various semiconducting TMDs via conventional lithographic techniques and experimentally evaluate the surface chemistries in order to understand the exact functionalization responsible for selected area growth control. Lastly, top-gated field effect transistors were successfully fabricated and measured on selectively-grown chemical vapor deposited monolayer molybdenum disulfide ($MoS_2$) on sapphire substrates for the first time.

The materials and methods employed in these experiments are now described.

Substrate Patterning

Substrates are cleaned in a standard procedure by sonication in acetone and IPA solvents followed by Nanostrip etch (Piranha solution: sulfuric acid/hydrogen peroxide) for 30 mins at 90° C. to remove organic contaminants and loose particulates. Prior to lithography, substrates are subjected to an oxygen plasma reactive ion etch (RIE) for 5 min at 150 watts power in a Plasma-Therm 720 system, in order to further clean the sapphire substrate surface as well as improve photoresist adhesion during spin application. Samples are dehydrated on a hot plate at 180° C. for 3 minutes and allowed to cool for 1 minute. HMDS (hexamethyldisilazane) adhesion promoter is first applied, either via a liquid-based spin process or vapor-phase application in a Yield Engineering Systems (YES) CVD oven, followed by spin-application of photoresist stack. SPR® 3012 positive photoresist is primarily used. After spin-application, 3012 resist is baked at 95° C. for 1 min. Once the resist stack has been applied, samples are exposed in a GCA 8500 Photolithography Stepper. Samples spun with 3012 resist are developed in MF® CD-26 developer solution for 60-90 seconds followed by DI rinse. Note that depending on the adhesion promoter and resist stack used, multiple exposure and develop steps in various developers may be required. For example, if PMGI resist is used in a bilayer resist stack (i.e. sapphire/PMGI/3012), following the develop of the top imaging resist, the PMGI must be exposed to DUV light for several minutes and then developed using a developer solution (Microchem 101A PMGI Developer) separate from the imaging resist developer solution. After development, samples are exposed to an $O_2$/He descum dry etch for 2 min at 100 watts power in a TePla M4L etch tool, which ensures the elimination of photoresist residue in developed regions. Lastly, samples are then stripped of the photoresist mask in PRS3000™ at ~80° C. for 30 mins and rinsed in IPA and DI water.

Synthesis of Transition Metal DiChalcogenides

The growth of transition metal dichalcogenides was carried out using multiple techniques. $MoS_2$ was synthesized using a powder vaporization technique. Two mg $MoO_3$ powder (99.98% Sigma Aldrich) was put in an alumina crucible and located in the center of a horizontal furnace. 200 mg S (99.9995% Alfa Aesar) was put in a fused quartz crucible at 12 inch upstream of the furnace, where the temperature was heated to 130° C. by heating tape. The substrates were located ~7 mm downstream from the $MoO_3$. The $MoS_2$ monolayers were grown at 800° C. for 15 minutes with 100 sccm Ar as carrier gas at 710 Torr. Metal-organic chemical vapor deposition was utilized for the synthesis to tungsten diselenide ($WSe_2$). Tungsten selenide was synthesized using tungsten hexacarbonyl ($WCO_6$) (Sigma-Aldrich 99.99%) and dimethylselenium (($CH_3)_2Se$) (Nova Kem 99.999%) or hydrogen selenide ($H_2Se$) precursors (Matheson (99.99%) in a vertical cold wall reactor with an induction heated susceptor as described previously. The precursors were transported into the system via a bubbler manifold allowing for independent control over each precursor concentration. The carrier gas consisted of 100% $H_2$ being optimal. The samples were heated to 500° C. at 80° C./min and annealed for 15 min to drive off any water vapor. Samples were then heated to growth temperatures ranging from 600 to 900° C. at 80° C./min. Upon reaching the growth temperature the tungsten hexacaronyl and dimethylselenium were introduced into the reaction chamber. Growth took place at total pressures at 700 Torr and growth times were varied depending on the amount of coverage needed from 10 min-40 min. The Se and W concentrations were varied by changing the $H_2$ carrier gas flow rate from 5 to 30 sccm at bubbler pressures of 760 Torr and room temperature for Se and 700 Torr for W and a bubbler temperature of 30° C. Samples were naturally cooled to room temperature after the growth step was complete. Both samples were characterized by the atomic force microscopy (Digital Instrument), field-emission scanning electron microscopy (Zeiss Merlin and Leo), and Witec Raman and photoluminescence mapping as detailed below.

Substrate and TMD Analysis

X-Ray Photoelectron spectroscopy (XPS) measurements were performed using an XPS Kratos Ultra. An Al-Kα source with energy of 1386 eV was used as the x-ray source. The samples were loaded on an aluminum bar with the help of copper clips. The X-ray spot size was in a 100 µm×50 µm ellipse. For the survey spectra, a dwell time of 150 ms with a step size of 0.3 eV was used. For high resolution spectra, a dwell time of 2000 ms with a step size of 0.1 eV was used at each energy window. Scanning electron microscopy (SEM) images were taken in a Zeiss Leo 1530 and Zeiss Merlin Field Emission SEM (FESEM) systems. Optical images were taken in a Nikon L200ND high resolution optical microscope. Contact angle was done in Ramé-Hart Model 295 Automated Goniometer/Tensiometer in ambient. A WITec CRM200 confocal Raman microscope with 488 nm laser wavelength was utilized for structural characterization at room temperature in ambient.

Device Fabrication and Electrical Measurements

Alignment marks were etched into the sapphire substrates to enable alignment of subsequent device layers and to withstand the high-temperature $MoS^2$ growth. Substrates were then cleaned and patterned for selective growth as outlined previously. $MoS_2$ growth was then carried out as outlined above in the Methods section. 15/15 nm Nb/Au source/drain contacts are defined by photolithography and deposited by e-beam evaporation followed by a standard lift-off process in acetone and PRS™-3000. Following contact metallization, sample was submerged in a LN bath for 15 minutes. After the LN treatment, devices were annealed at 250° C. in forming gas ($H_2/N_2$) at ambient pressure for 5 minutes to improve the $MoS_2$-metal interface and remove organic residue from the $MoS_2$ channel surface. Prior to atomic layer deposition (ALD) of high-k gate dielectric, a 2 nm $Al_2O_3$ seed layer was deposited by e-beam evaporation. 20 nm $Al_2O_3$ gate dielectric was then grown at 250° C. in a KJ Lesker ALD 150LE tool. To allow for effective electrical contact with probes, $Al_2O_3$ dielectric was etched above contact pads using an MF® CD-26 developer-based wet etch. Gates were defined by e-beam lithography, and 10/50 nm Ti/Au gates were formed by e-beam evaporation and lift-off. Devices were measured in a Cascade probe station using a Keithley 4200 Semiconductor Analyzer at room temperature and in ambient.

The results of the experiments are now described.

Figures 10A, 10B, 10C, 10D, 10E:
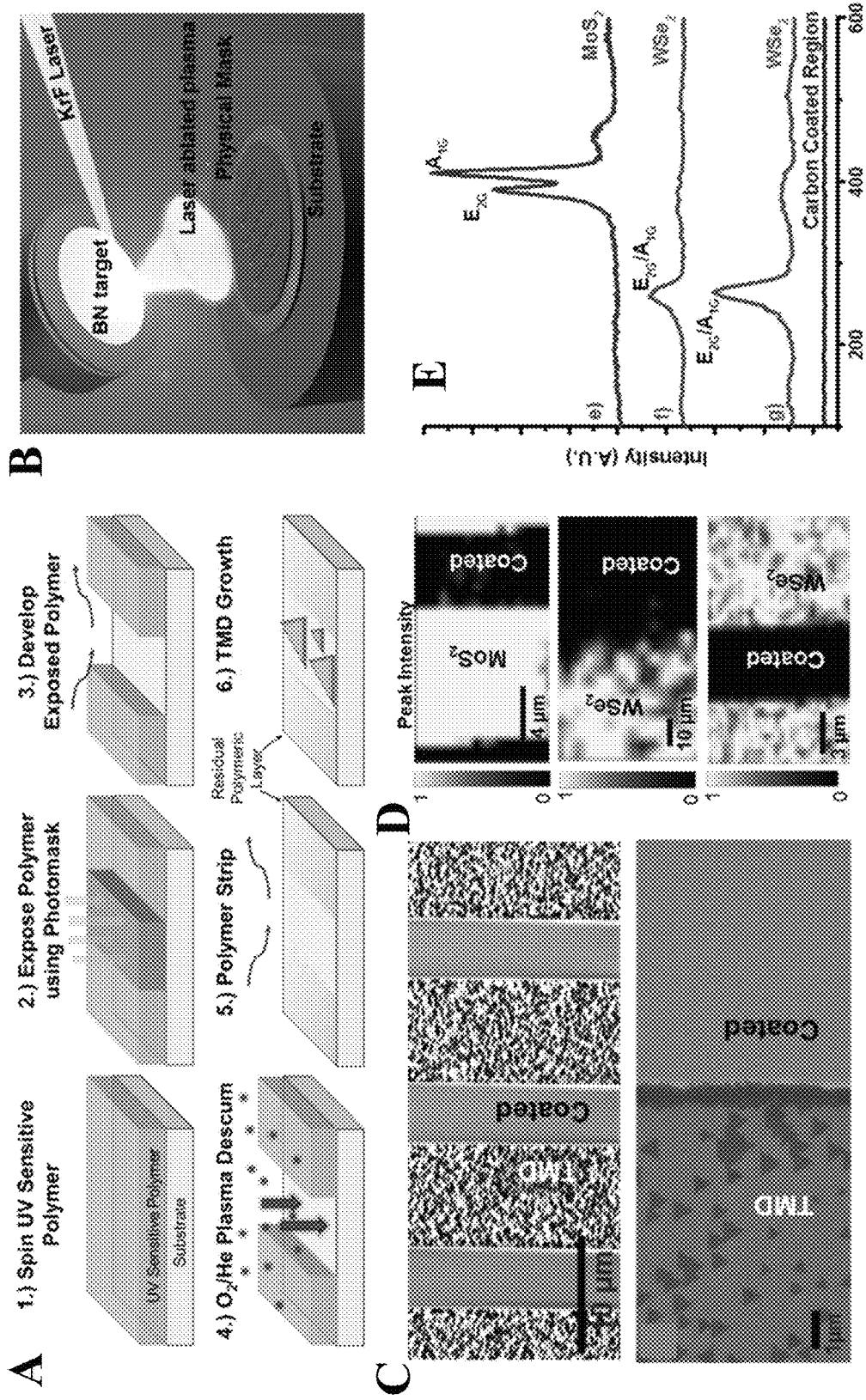
FIG. 10A through FIG. 10E, depicts results of experiments showing selective growth of two-dimensional materials.
Figures 14A, 14B, 14C, 14D, 14E, 14F, 14G, 14H, 14I:
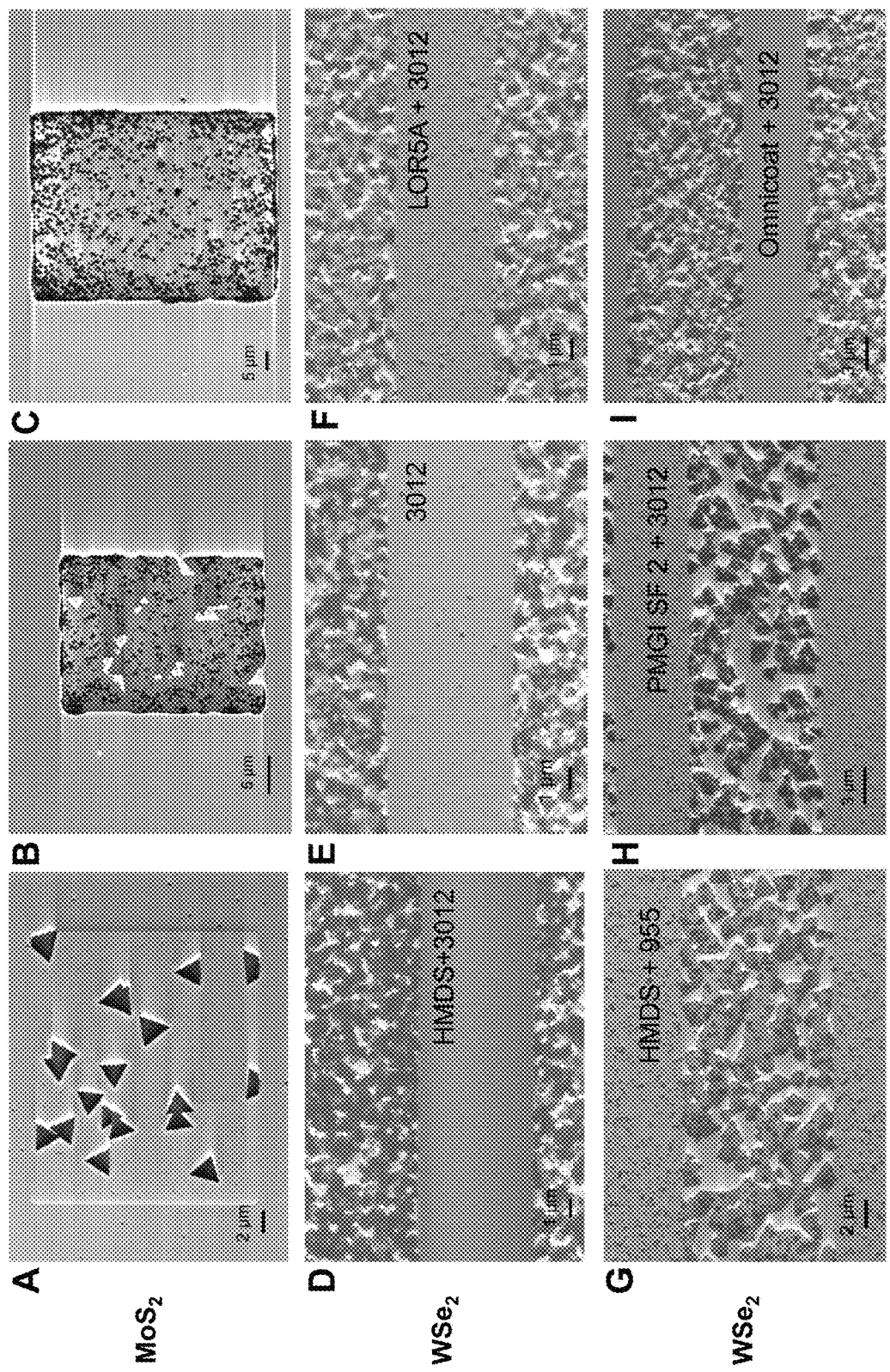
FIG. 14A through FIG. 14I, depicts results of experiments showing scanning electron microscopy (SEM) images of $MoS_2$ and $WSe_2$ synthesized via the selective growth process utilizing a polymer functional layer.

The data presented herein demonstrates a process to achieve selected area growth of various TMDs on optoelectronic substrates through a facile surface functionalization technique. The ability to utilize different surface functionalizations to achieve selected growth allows for precise control over where the TMDs grow. FIGS. 10A and 10B depicts schematic of the process for obtaining different surface functionalizations on the surface. Utilization of conventional lithographic processing techniques (FIG. 10A) leaves a polymeric residue on the sample surface (coated region), which can then be placed directly into a synthesis system allowing for growth only in the uncoated regions on the substrate surface (FIGS. 10C and 10D). In summary, photoresist is spun onto the substrate, a pattern is exposed via UV-lithography, that pattern is developed away, revealed substrate is exposed to an $O_2$/He descum etch, and the remaining photoresist mask stripped in a standard photoresist remover. In particular, samples are stripped of the photoresist mask in PRS-3000™ at ~80° C. for 30 mins and rinsed in IPA and DI water. This standard photoresist strip employed here has two purposes: to further remove any remaining photoresist residue from the growth (developed) regions of the substrate, while leaving a residual photoresist layer behind in the coated (non-developed) regions. Once the photoresist strip is complete, there is a lithographically-defined carbonaceous mask that is left on the substrate. Although not directly explored or quantified, the photoresist residue mask seems to be stable on the surface and still suitable for templated growth weeks after initial processing. Shipley Megaposit® SPR® 3012 positive photoresist is primarily used as the optical photoresist of choice for templated growth because of its ease of use, relative inexpensiveness and wide process latitude. However, the selected area growth process is compatible with many different resists/resist stacks including other optical resists (SPR® 955), common lift-off bilayer resist stacks (PMGI/LOR+3012/955), and e-beam photoresists (ZEP520A/Anisole 1:1) (FIG. 14). The use of an adhesion promoter is also not necessary, but the degree of selectivity and consistency of results seems to be slightly improved when they are used. Excellent selectivity and uniformity was observed when using both hexamethyldisilazane (HMDS) and Omnicoat™ as adhesion promoters for SPR 3012 imaging resist.

This selected area growth was also shown to be compatible when utilizing amorphous boron nitride as a mask, which is achieved by pulsed laser deposition through a shadow mask onto the surface (FIG. 10B) which will also preclude the growth (FIG. 10E). In both cases, there is an amorphous layer where crystal growth is not favored and a clean, highly crystalline substrate region where nucleation and growth occurs.

Figures 15A, 15B, 15C, 15D, 15E, 15F:
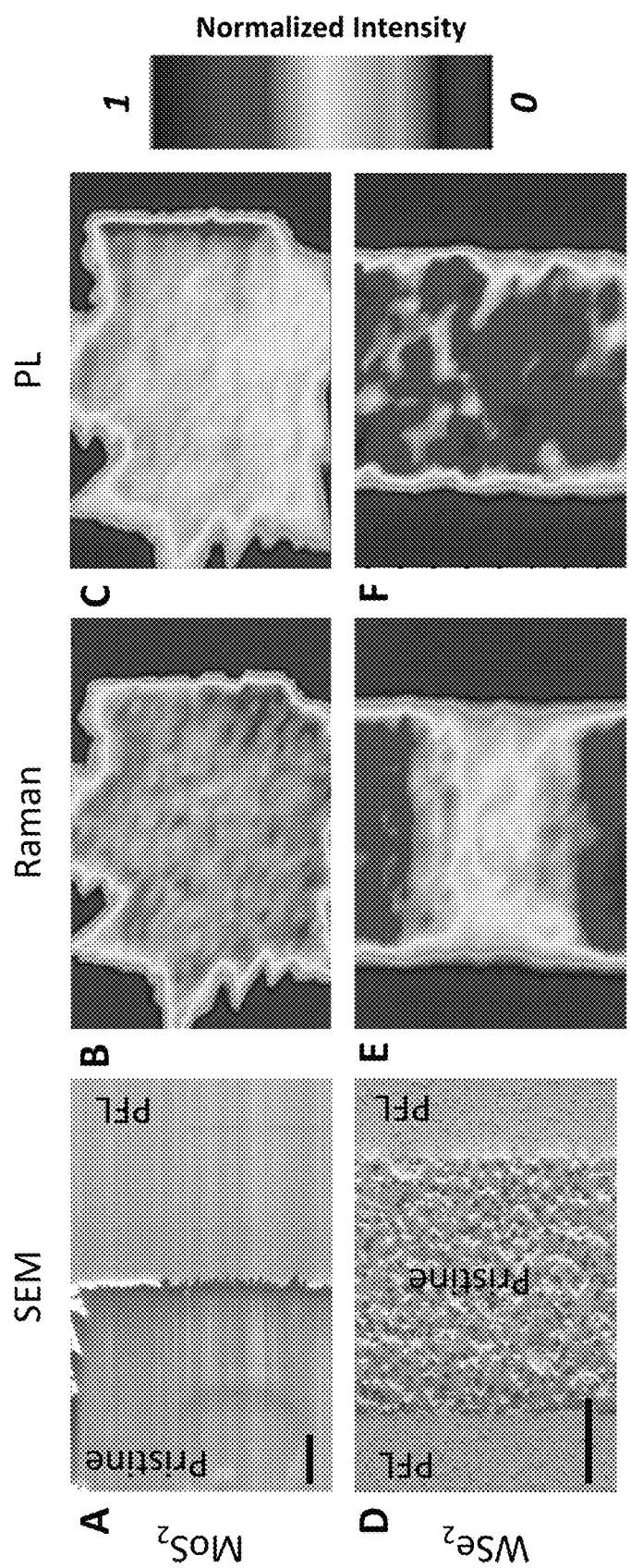
FIG. 15A through FIG. 15F, depicts results of experiments showing SEM images and Raman and PL maps for $MoS_2$ and $WSe_2$ synthesized in the selective process.

The substrates patterned for selective area growth have been shown to successfully grow different TMDs using a variety of synthesis methods. $MoS_2$, $WSe_2$ and $MoSe_2$ can all be selectively grown using powder vaporization or metal-organic chemical vapor deposition techniques. These growth techniques are very different in terms of reactor design and growth conditions and also require very different precursors including molybdenum trioxide ($MoO_3$), tungsten hexacarbonyl ($WCO_6$), elemental sulfur, dimethylselenium (($CH_3$)$_2$Se), and hydrogen selenide ($H_2Se$). This suggests the growth technique or precursor chemistry does not play a role in the ability to obtain selectivity. Raman maps of the $E_{2G}/A_{1G}$ intensity peaks on the selective area samples (FIG. 10E) are shown to have very high intensity peaks in the uncoated regions while no peaks are present in the coated regions (FIG. 10E) suggesting a very high degree of selectivity. PL maps also demonstrate a high presence of monolayer material growth in the uncoated regions (FIG. 15). Interestingly, the lateral growth of $MoS_2$ and $WSe_2$ domains nucleated within uncoated "growth" regions are stopped exactly at the boundary between coated and non-coated substrate regions, demonstrating a powerful means for exact geometrical control of TMD films (FIGS. 14, 15). This suggests the first robust process that can allow for selective growth across the spectrum of TMDs that could also be applied to multiple substrates and growth techniques. However, the surface functionalization that leads to precluded growth must also be understood.

Figures 11A, 11B, 11C:
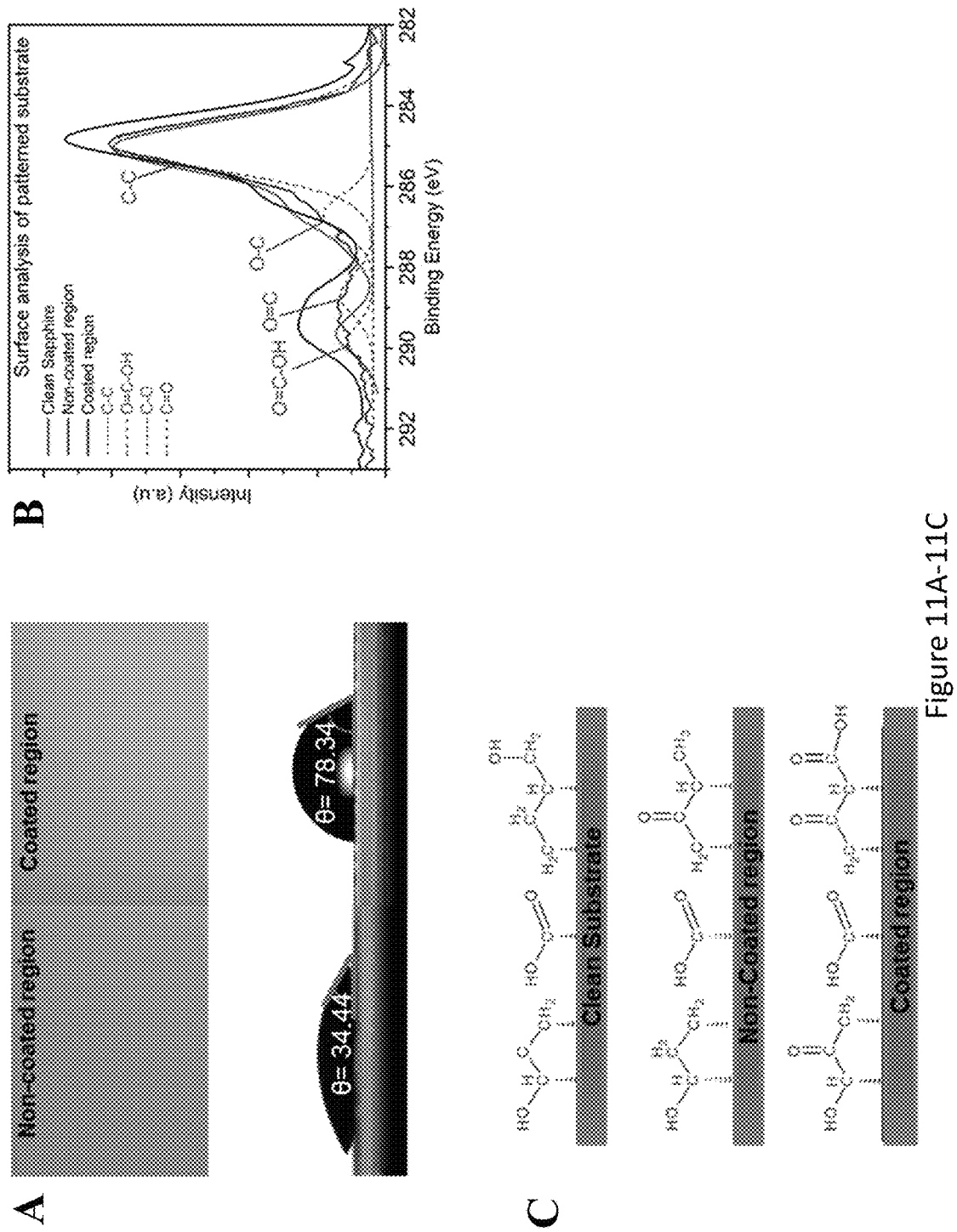
FIG. 11A through FIG. 11C, depicts results of experiments showing substrate surface functionalization plays a critical role in determining the final growth selectivity.
Figures 16A, 16B, 16C, 16D:
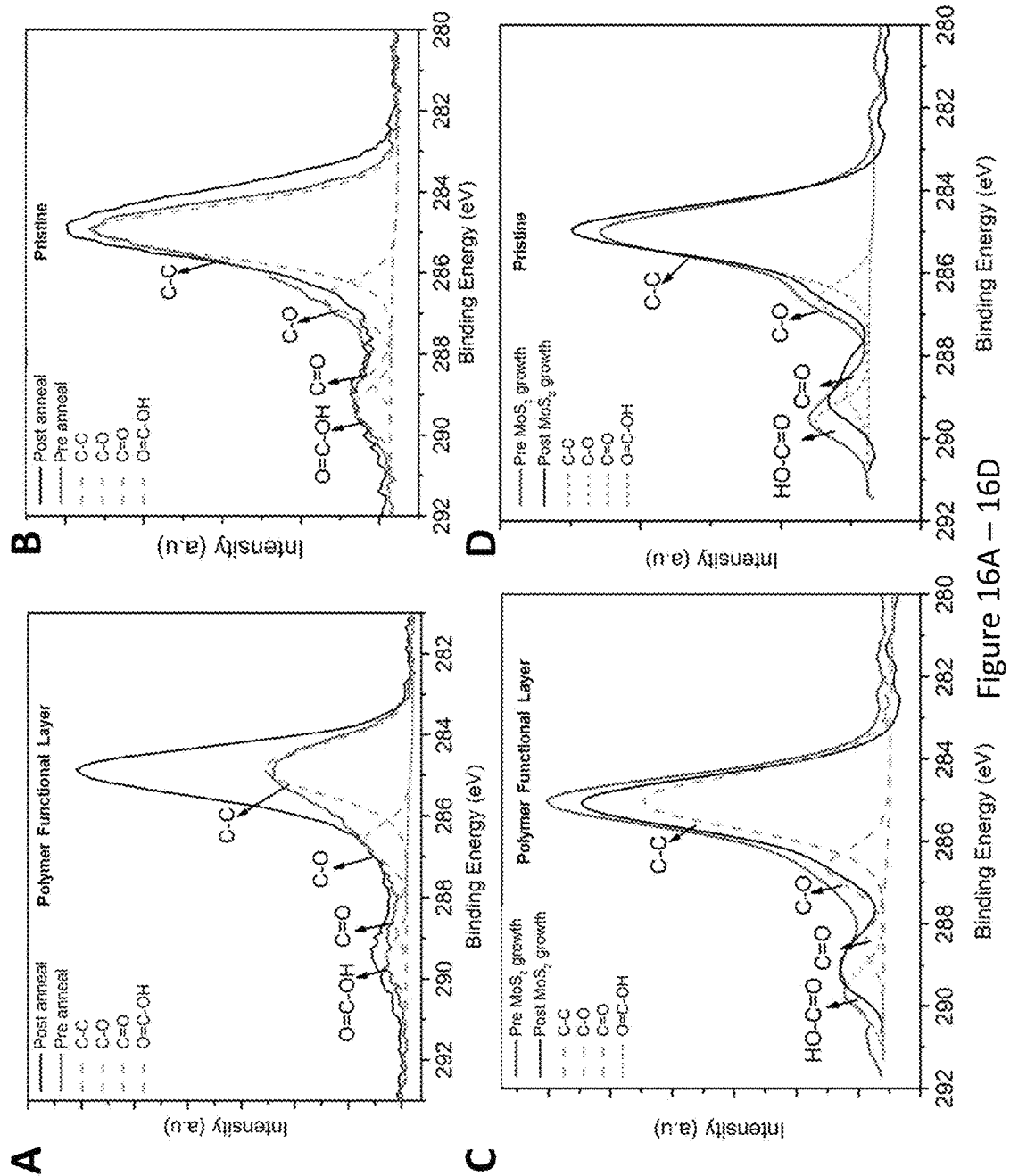
FIG. 16A depicts the high resolution C is of the polymer functional layer after the temperature at 800° C. anneal showing the increase in the C—C bonding.
FIG. 16B depicts the high resolution C is of the pristine sapphire surface after the temperature anneal at 800° C. showing the nearly unaltered surface.
FIG. 16C depicts the high resolution C is of the polymer functional layer after the growth of $MoS_2$ at 800° C. on substrate regions where $MoS_2$ is not present.
FIG. 16D depicts the high resolution C 1s of the pristine sapphire surface after the growth of $MoS_2$ at 800° C. on substrate regions where $MoS_2$ is not present. As for the polymer functional layer, there is a slight increase in C—C bonding. As for the pristine surface, there is little change in the carbon functionalization which is most likely attributed to the presence of adventitious carbon.

The substrate surface functionalization clearly plays a critical role in determining the final growth selectivity. After patterning the surface, contact angle measurements were performed on both coated and non-coated regions of the surface. From FIG. 11A it is clear that the contact angle changes dramatically from non-coated (~35°) to coated (~78°) regions, respectively, denoting a significant change in the surface free energy. This is consistent with the fact that pristine sapphire is a hydrophilic surface. Furthermore, the thin polymeric residual layer is more than doubling the contact angle of the sapphire, thereby making the surface more hydrophobic and increasing the overall surface free energy. In order to further understand the exact chemistry of the coated and uncoated surfaces, XPS was carried out and compared with the clean sapphire surface prior to processing. Peak fitting for the carbon 1s (C 1s) high resolution was performed on the samples with a full width half maximum (FWHM) maintained at 0.99 for C—C at a position of 284.9 eV, FWHM of 0.89 for C—O at a position of 286.9 eV, FWHM of 0.88 for C=O at a position of 288.4 eV and FWHM of 0.86 for O=C—OH at a position of 289.6 eV. As can be observed from the high resolution C is spectra that was performed on the substrates before and after patterning, the clean sapphire contains primarily C—C, O—C and O=C (O=C—OH) which are shown in FIG. 11B and represented visually in FIG. 11C energy. After the patterning process, it is evident that the non-coated surface more closely resembles that of cleaned sapphire with only a slight change in the O=C—OH bonding which has presumably transformed primarily into the O=C bonding on the surface. This is also confirmation that the combination of develop, descum etch, and photoresist strip are effectively cleaning the substrate surface where $MoS_2$ is preferentially nucleating and growing. Unlike the non-coated region, the coated region displays a significant increase in the C—C and the C=O groups. The clear increase in bonded carbon in coated regions suggests that photoresist residue remaining on the surface is responsible for the increase in surface energy and inhibition of TMD growth there. Further XPS analysis was carried out on both pristine and polymer coated regions after high temperature annealing (FIGS. 16A and 16B) and $MoS_2$ growth conditions (high temperature in the presence of precursors) (FIGS. 16B and 16C) to see the effect on both regions and provide some insight into what transformations may take place during synthesis. For both the high temperature anneal and $MoS_2$ growths, there is little change in the carbon concentration and bonding on the pristine sapphire surface. As for the coated region, carbonization of the polymer is observed from the increase in C—C bonding.

Figures 12A, 12B, 12C, 12D:
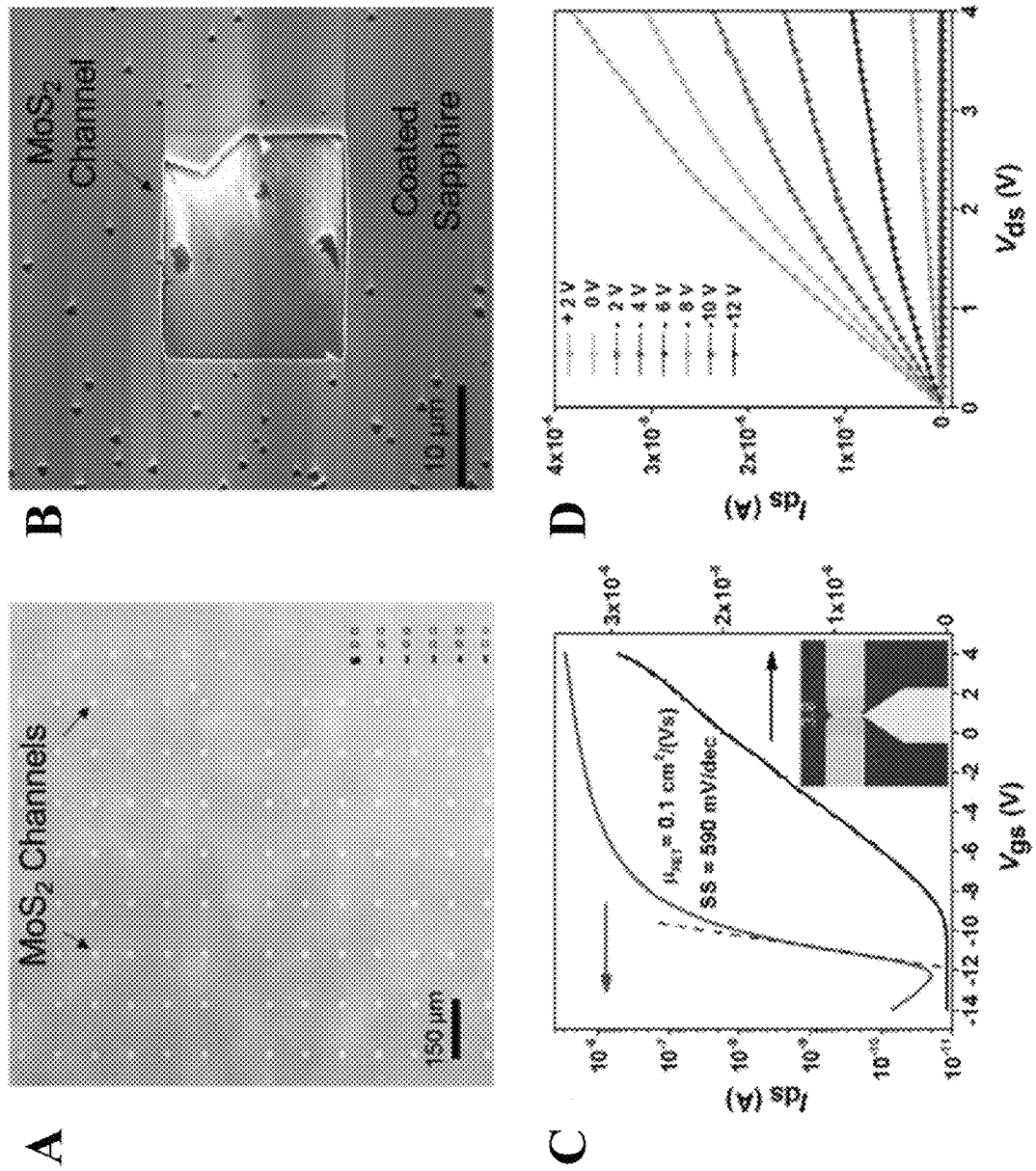
FIG. 12A through FIG. 12D, depicts results of experiments showing
Figure 13:
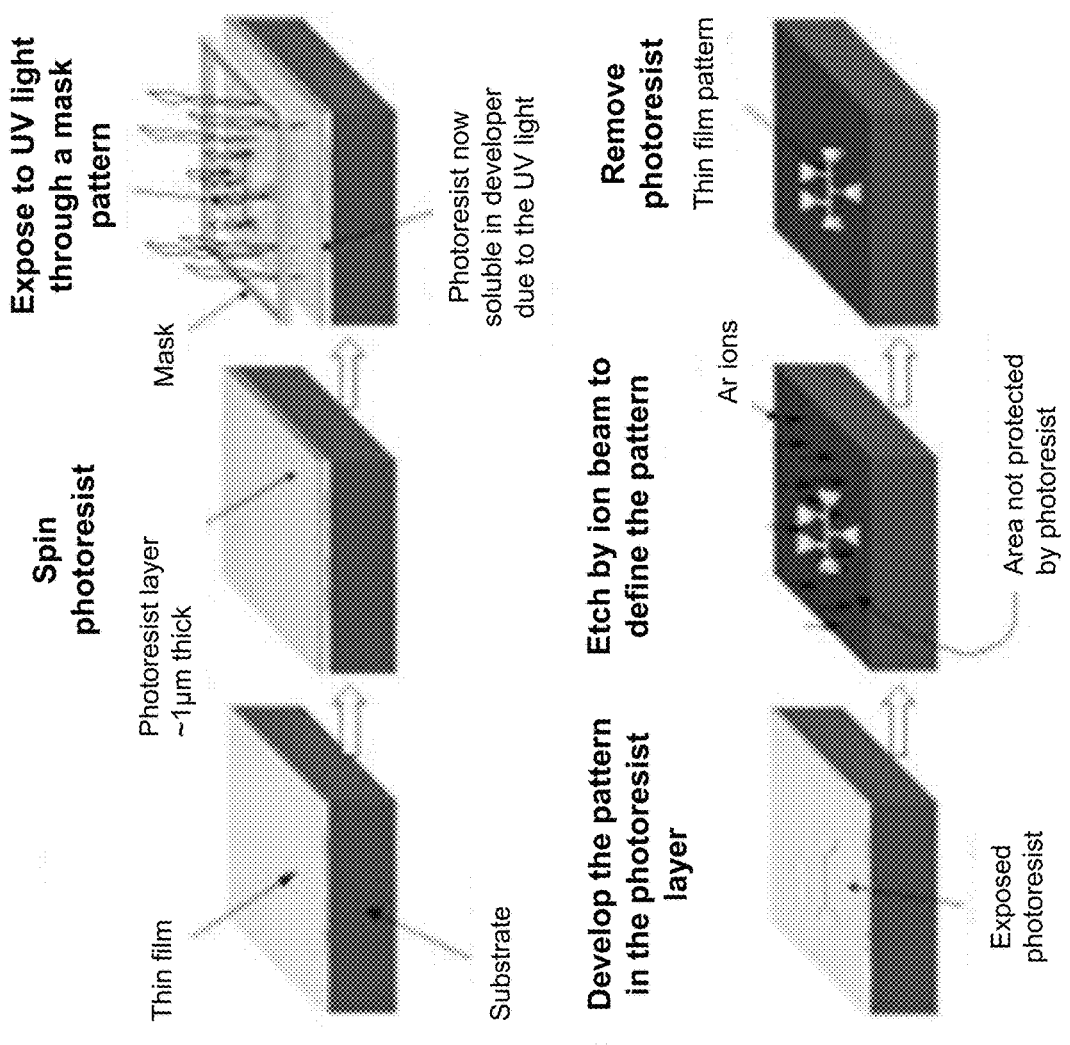
FIG. 13 depicts a schematic diagram of an exemplary method producing uncoated regions on a substrate.
Figure 17:
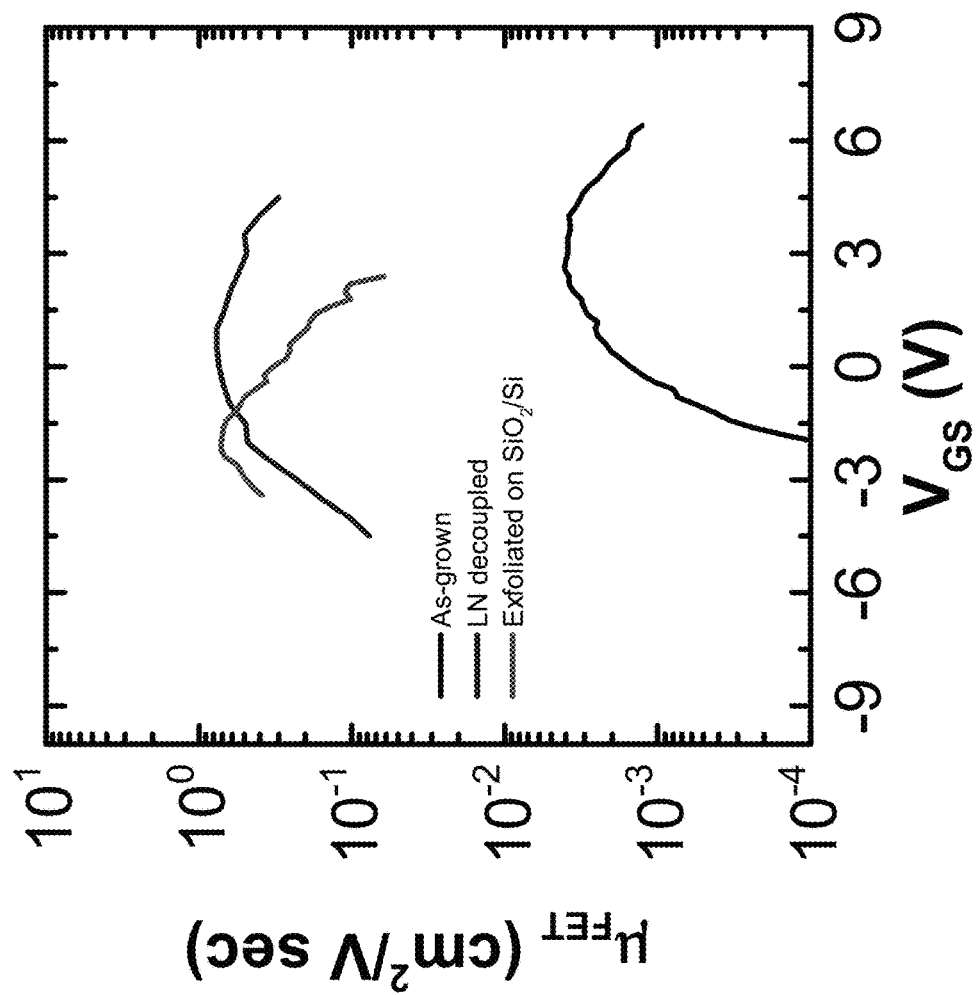
FIG. 17 depicts a comparison of field effect mobility ($\mu_{FET}$) as a function of gate voltage for as-grown $MoS_2$ on sapphire, $MoS_2$ on sapphire exposed to liquid nitrogen (LN) decoupling treatment, and $MoS_2$ mechanically exfoliated onto $SiO_2$/Si. It is clear that $MoS_2$ as-grown on sapphire displays a very poor FET mobility $\sim 10^{-4}$-$10^{-3}$ $cm^2$/Vs. 15 min LN submersion is effective in decoupling the $MoS_2$ from the sapphire substrate and restoring mobility values to that of exfoliated $MoS_2$~0.1-1 $cm^2$/Vs.

Top-gated field effect transistors (FETs) were fabricated on as-grown patterned $MoS_2$ channels in order to demonstrate the ease and viability of this templated growth method for future device fabrication and to investigate the electrical performance of CVD $MoS_2$ layers directly grown on sapphire. The mask used for the sapphire patterning consisted of an array of 25×25 μm squares in which subsequent $MoS_2$ growth is confined to, thereby defining the active device channels and eliminating the need for reactive-ion etching of continuous $MoS_2$ films to isolate transistor channels. A low magnification optical image of selectively grown $MoS_2$ channels across a large substrate area is shown in FIG. 12A. This selective growth process also eliminates the need for a complicated transfer process which can introduce mechanical defects or cause unintentional doping, consequences often encountered in graphene synthesis and applied graphene research. As a result, the number of lithographic levels for device fabrication post-TMD synthesis is limited to only three steps: source/drain metallization, ALD dielectric etch, and gate metallization levels. After growth, $MoS_2$ channels were examined by optical microscopy and SEM; depending on location on the substrate, channels are predominantly monolayer with grain size typically >10 microns. These channels are comprised of several, large grains coalesced into a continuous film as shown in FIG. 12B. Length and width of $MoS_2$ channels varied from device to device based on local growth conditions during the powder vaporization synthesis. Niobium was chosen as a contact based on its low work function ($\Phi_{Nb}$~4.3 eV) relative to the electron affinity of $MoS_2$ ($\chi_{MoS2}$~4.2 eV). Following contact metallization, devices were submerged in a liquid nitrogen (LN) bath for 15 mins in order to "decouple" the $MoS_2$ from the sapphire substrate, a technique that was adopted as a way to improve the mobility of non-transferred $MoS_2$ films directly synthesized on sapphire growth substrates. Without LN treatment or similar decoupling techniques, extremely low field-effect mobility is observed in the range of $10^{-3}$-$10^{-4}$ $cm^2$/(V s) for as-grown monolayer $MoS_2$ top-gated devices on sapphire (FIG. 17). 2 nm $Al_2O_3$ seed layer was deposited by e-beam evaporation followed by 20 nm ALD $Al_2O_3$ gate dielectric. 10/50 nm Ti/Au was used for gate metal.

The resulting transistor transfer ($I_{ds}$-$V_{gs}$) and output ($I_{ds}$-$V_{ds}$) curves are displayed in FIGS. 12C and 12D, respectively. Devices display a typical field-effect mobility, $\mu_{FET}$, of 0.1-1 $cm^2$/(V s) extracted from the equation for transconductance $g_m=\mu_n C_{ox}$ (W/L)$V_{ds}$. The transconductance ($g_m$=$dI_{ds}$/$dV_{gs}$) is determined from the slope of the linear region of the transistor transfer curve, which plots drain current as a function of gate voltage at a constant drain bias (in this case $V_{ds}$=0.5 V). For this mobility extraction, the dielectric constant of 9 and thickness of 22 nm was used to estimate the capacitance of the ALD $Al_2O_3$ film. The actual gate dielectric capacitance could be lower than the estimated value due to the presence of a several nanometer thick seed layer. In this regard, the mobility reported here is a lower-end estimate of the true field-effect mobility. The field-effect mobility for monolayer CVD $MoS_2$ on sapphire (post decoupling in LN bath) is comparable to low-end mobilities reported for mechanically exfoliated $MoS_2$ (0.1-10 $cm^2$/(V s)), and for CVD $MoS_2$ with similar grain size on $SiO_2$/Si substrates reported by Najmaei et al (0.2-18 $cm^2$/(V s)). The large negative threshold voltage ($V_T$=-8.5 V) also suggests a substantial amount of interface charge present at the $MoS_2$—$Al_2O_3$ interface. Devices demonstrate subthreshold swings in the range of 380-590 mV/dec. Subthreshold characteristics are determined from the inverse slope of the linear portion of the $I_{ds}$-$V_{gs}$ curve in log scale (Subthreshold swing=1/[d log($I_{ds}$)/$dV_{gs}$]). Large current ON/OFF ratios >$10^5$-$10^6$ are also observed in these devices. From the output curves, it is clear there is a linear increase in $I_{ds}$ with $V_{ds}$ at low $V_{ds}$, which suggests relatively ohmic contacts. Surely, device performance can be improved by optimization of the $MoS_2$-high-k dielectric interface; Sanne et al. saw improved current saturation and higher current densities with $HfO_2$ ($\varepsilon_{ox}$=15-19) as a gate dielectric compared to $Al_2O_3$ in similar top-gated architectures on monolayer CVD $MoS_2$ grown directly on $Si_3N_4$ substrates (Sanne et al., 2015, Appl Phys Lett 105:062101). Additional improvements in device performance can be achieved with the utilization of "true" ohmic contacts via low work function Sc ($\Phi_{Sc}$~3.5 eV) contacts which can improve carrier injection through ultra-low Schottky barrier formation (~30 meV) (Das et al, 2013, Nano Lett 13:100-5). Lastly, Amani et al. recently investigated the growth substrate induced performance degradation in monolayer CVD $MoS_2$ FETs on $SiO_2$/Si and saw about an order of magnitude decrease in field-effect mobility for as-grown devices verse transferred devices (Amani et al., 2014, Appl Phys Lett 104:203506). The reasons for this device performance degradation have been attributed to a combination of $SiO_2$ interface contamination and strain introduced into the $MoS_2$. While the mechanisms for this mobility reduction seen in these samples may not be entirely the same for sapphire as for $SiO_2$/Si, this further demonstrates the importance of growth substrate interactions with atomically thin two-dimensional semiconductors.

While 2D materials has shown to provide an exciting new area that has potential to revolutionize next generation devices, it has been hampered by the ability to synthesize and fabricate complex device structures and to tailor the growth properties. These data provide a highly robust lithographic technique involving only standard photoresist application, exposure, develop, and strip steps to selectively functionalize the surface through ultra-thin polymeric residues that is compatible with various resist stacks and adhesion promoters. This has been shown to be true for a variety of TMDs and synthesis techniques, which can apply to a wide swath of researchers. XPS analysis shows the selectivity is due to increased C—C and C=O bonding in the coated regions that precludes the growth. For the first time, top-gated field-effect transistors fabricated on selectively-grown CVD $MoS_2$ on sapphire have been demonstrated and display device performance metrics on par with literature for similar $MoS_2$ devices on other growth substrates. Finally, recognizing the impact of 2D materials, it can be expected that the ability to selectively synthesize 2D materials, more specifically TMDs, can open up new opportunities for devices including the ability to tune the electronic and optoelectronic properties.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of fabricating a two-dimensional structure, comprising the steps of:
   coating a portion of a substrate with a resist material to define a coated region and an uncoated region of the substrate surface;
   positioning the substrate in a growth chamber;
   transforming the resist material into a carbonaceous mask on the coated region of the substrate surface;
   adding a chalcogen-based material to the growth chamber; and
   growing a two-dimensional structure on the substrate, wherein the growth of the two dimensional structure is limited to the uncoated region of the substrate surface; and
   wherein the carbonaceous mask is left on the substrate surface after growth of the two-dimensional structure.

2. The method of claim 1, wherein coating a portion of a substrate further comprises:
   coating the substrate with a resist material; and
   patterning the resist material to expose the uncoated region of the substrate surface.

3. The method of claim 1, wherein the substrate is selected from the group consisting of sapphire, silicon, silicon carbide, silicon dioxide, graphene, graphite, non-alkali glass, poly-silicon carbide, quartz, and poly-silicon.

4. The method of claim 1, wherein the resist material is selected from the group consisting of an optical photoresist, a lift-off bilayer resist stack, and an e-beam resist.

5. The method of claim 1, wherein the chalcogen-based material comprises a chalcogen element and a second element selected from the group consisting of a transition metal, a group-III element, a group IV element and any combination thereof.

6. The method of claim 5, wherein the chalcogen-based material is selected from the group consisting of $WSe_2$, $WS_2$, $MoSe_2$, and $MoS_2$.

7. The method of claim 1, wherein growing a two-dimensional structure on a substrate further comprises using a process selected from the group consisting of powder vaporization and metal-organic chemical vapor deposition.

8. A two-dimensional structure produced by the method of claim 1.

9. The two-dimensional structure of claim 8, where in the two-dimensional structure is heterogeneous.

10. A device comprising a two-dimensional structure produced by the method of claim 1.

11. A method of controlling lateral growth of a two-dimensional structure on a substrate surface, the method comprising:
    coating a portion of a substrate surface with a resist material to define a coated region and an uncoated region of the substrate surface;
    transforming the resist material into a carbonaceous mask that is left on the coated region of the substrate surface; and
    growing a two-dimensional structure on the uncoated region of the substrate surface, wherein lateral growth of the two dimensional structure is prohibited by the carbonaceous mask at the interface of the uncoated and coated substrate surface; and
    wherein the carbonaceous mask is left on the substrate surface after growth of the two-dimensional structure.

12. The method of claim 11, wherein coating a portion of a substrate further comprises:
    coating the substrate with a resist material; and
    patterning the resist material to expose the uncoated region of the substrate surface.

13. The method of claim 11, wherein the two dimensional structure comprises a chalcogen based material.

14. The method of claim 13, wherein the chalcogen-based material comprises a chalcogen element and a second element selected from the group consisting of a transition metal, a group-III element, a group IV element and any combination thereof.

15. The method of claim 14, wherein the chalcogen-based material is selected from the group consisting of $WSe_2$, $WS_2$, $MoSe_2$, and $MoS_2$.

16. The method of claim 11, wherein the substrate is selected from the group consisting of sapphire, silicon, silicon carbide, silicon dioxide, graphene, graphite, non-alkali glass, poly-silicon carbide, and poly-silicon.

17. The method of claim 11, wherein the resist material is selected from the group consisting of an optical photoresist, a lift-off bilayer resist stack, and an e-beam photoresist.

18. The method of claim 11, wherein growing a two-dimensional structure on a substrate further comprises using a process selected from the group consisting of powder vaporization and metal-organic chemical vapor deposition.

19. A two-dimensional structure produced by the method of claim 11.

20. A device comprising a two-dimensional structure produced by the method of claim 11.

* * * * *